United States Patent
Choi et al.

(10) Patent No.: US 9,202,970 B2
(45) Date of Patent: Dec. 1, 2015

(54) LIGHT EMITTING DEVICE AND LIGHT EMITTING DEVICE PACKAGE HAVING THE SAME

(71) Applicant: LG INNOTEK CO., LTD., Seoul (KR)

(72) Inventors: Jae Hoon Choi, Seoul (KR); Buem Yeon Lee, Seoul (KR); Ki Young Song, Seoul (KR); Rak Joon Choi, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 14/056,278

(22) Filed: Oct. 17, 2013

(65) Prior Publication Data
US 2014/0110663 A1    Apr. 24, 2014

(30) Foreign Application Priority Data
Oct. 18, 2012 (KR) .................. 10-2012-0116006
Oct. 18, 2012 (KR) .................. 10-2012-0116007

(51) Int. Cl.
| | |
|---|---|
| H01L 33/06 | (2010.01) |
| H01L 33/12 | (2010.01) |
| H01L 33/22 | (2010.01) |
| H01L 33/00 | (2010.01) |
| H01L 33/42 | (2010.01) |
| B82Y 20/00 | (2011.01) |
| H01L 21/02 | (2006.01) |

(52) U.S. Cl.
CPC .............. *H01L 33/06* (2013.01); *H01L 33/007* (2013.01); *H01L 33/12* (2013.01); *H01L 33/22* (2013.01); *B82Y 20/00* (2013.01); *H01L 21/0237* (2013.01); *H01L 21/0254* (2013.01); *H01L 21/02444* (2013.01); *H01L 21/02472* (2013.01); *H01L 21/02502* (2013.01); *H01L 21/02513* (2013.01); *H01L 33/42* (2013.01); *Y10S 977/734* (2013.01); *Y10S 977/95* (2013.01)

(58) Field of Classification Search
CPC ... H01L 33/007; H01L 33/0075; H01L 33/12; H01L 33/22; H01L 33/30; H01L 33/32; Y10S 977/734
See application file for complete search history.

(56) References Cited

U.S. PATENT DOCUMENTS

| | | | |
|---|---|---|---|
| 2005/0199886 A1 | 9/2005 | Yi et al. ...................... 357/79 |
| 2006/0091408 A1* | 5/2006 | Kim et al. .................... 257/94 |

(Continued)

FOREIGN PATENT DOCUMENTS

| | | |
|---|---|---|
| JP | 2005-260230 A | 9/2005 |
| JP | 2011-009382 A | 1/2011 |

OTHER PUBLICATIONS

Machine translation of JP 2011-009382 A.*

(Continued)

*Primary Examiner* — Bryan Junge
(74) *Attorney, Agent, or Firm* — Ked & Associates, LLP

(57) ABSTRACT

A light emitting device includes a nano-structure, a first semiconductor layer on the nano-structure, an active layer on the first semiconductor layer, and a second conductive semiconductor layer on the active layer. The nano-structure includes a graphene layer provided under the first semiconductor layer to make contact with the first semiconductor layer; and a plurality of nano-textures extending from a top surface of the graphene layer to the first semiconductor layer and in contact with the first semiconductor layer.

20 Claims, 23 Drawing Sheets

(56) References Cited

U.S. PATENT DOCUMENTS

| | | | |
|---|---|---|---|
| 2011/0129675 A1 | 6/2011 | Choi et al. | 428/408 |
| 2012/0141799 A1 | 6/2012 | Kub et al. | 428/408 |
| 2012/0175662 A1 | 7/2012 | Min et al. | 257/99 |

OTHER PUBLICATIONS

Japanese Office Action dated Aug. 20, 2014 issued in Application No. 2013-216121.

* cited by examiner

US 9,202,970 B2

LIGHT EMITTING DEVICE AND LIGHT EMITTING DEVICE PACKAGE HAVING THE SAME

CROSS-REFERENCE TO RELATED APPLICATIONS

The present application claims priority under 35 U.S.C. §119(a) of Korean Patent Application No. 10-2012-0116006 and 10-2012-0116007 filed on Oct. 18, 2012, which is hereby incorporated by reference in its entirety.

BACKGROUND

The light emitting device is a semiconductor light emitting device or a semiconductor light emitting diode including a semiconductor material to convert electric energy to light. Studies and researches have been actively carried out in relation to a light emitting device package including a light emitting device.

In comparison with other light sources such as a fluorescent lamp and an incandescent lamp, the semiconductor light emitting device is advantageous because of low power consumption, a long lifetime, a fast response time, safety, and environment-friendliness. Accordingly, many studies and researches to substitute the existing light sources with the semiconductor light emitting device have been carried out.

In addition, semiconductor light emitting devices have a tendency increasingly used as light sources of a variety of lamps used in indoor and outdoor places, liquid crystal displays, electronic displays, or lighting devices such as streetlamps.

The above references are incorporated by reference herein where appropriate for appropriate teachings of additional or alternative details, features and/or technical background.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

BRIEF DESCRIPTION OF THE DRAWINGS

The embodiments will be described in detail with reference to the following drawings in which like reference numerals refer to like elements wherein.

DETAILED DESCRIPTION

In the description of embodiments, it will be understood that when one component is referred to as being 'on (above)' or 'under (below)' another component, the terminology of 'on (above)' and 'under (below)' includes both the meanings of 'directly' and 'indirectly'. Further, the meaning of 'on' and 'under' each layer includes not only an upper direction, but also a lower direction.

Figure 1:
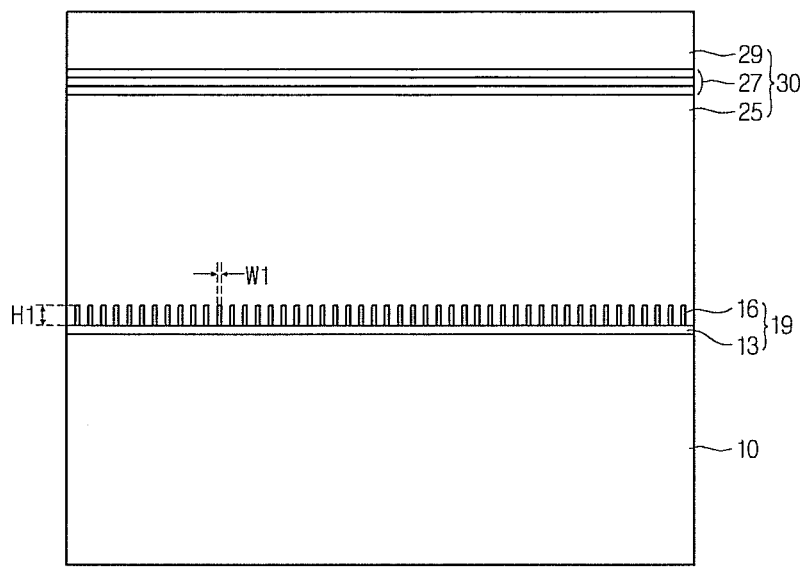
FIG. 1 is a sectional view showing a light emitting device according to the embodiment.

FIG. 1 is a sectional view showing a light emitting device according to the embodiment.

Referring to FIG. 1, a light emitting device according to the embodiment may include a substrate 10, a nano-structure 19, and a light emitting structure 30. The light emitting structure 30 may include a first conductive semiconductor layer 25, an active layer 27, and a second conductive semiconductor layer 29. The nano-structure 19 may include a graphene layer 13 and a plurality of nano-textures 16.

The light emitting device according to the embodiment may include a buffer layer (not shown) disposed between the substrate 10 and the light emitting structure 30. The light emitting device according to the embodiment may further include another semiconductor layer (not shown) disposed under and/or on the light emitting structure 30. The light emitting device according to the embodiment may further include an undoped semiconductor layer (not shown) disposed between the buffer layer and the light emitting structure 30.

The substrate 10 includes a material to grow a semiconductor layer such as the light emitting structure 30. In order to stably grow the light emitting structure 30, the substrate 10 may include a material making a less difference from the light emitting structure 30 in terms of a lattice constant.

The substrate 10 may include at least one selected from the group consisting of sapphire ($Al_2O_3$), SiC, Si, GaAs, GaN, ZnO, Si, GaP, InP, and Ge.

The buffer layer may be disposed between the substrate 10 and the light emitting structure 30. The buffer layer may be formed to reduce the lattice constant difference between the substrate 10 and the light emitting structure 30. Each of the buffer layer and the light emitting structure 30 may include group II to VI compound semiconductor materials.

A lattice defect, for example, dislocation may occur between the light emitting structure 30 and the substrate 10 due to the lattice constant difference. The dislocation may refer to a boundary line formed in a direction perpendicular to the light emitting structure 30 due to the lattice defect between the substrate 10 and the light emitting structure 30. The dislocation may degrade the electrical and optical characteristics of the light emitting device and prevent light emission. In order to solve the above problem, according to the first embodiment, the nano-structure 19 may be disposed between the substrate 10 and the buffer layer. Alternatively, the nano-structure 19 may be disposed between the substrate 10 and the light emitting structure 30.

The nano-structure 19 may be disposed on the entire region of the substrate 10.

Figure 2:
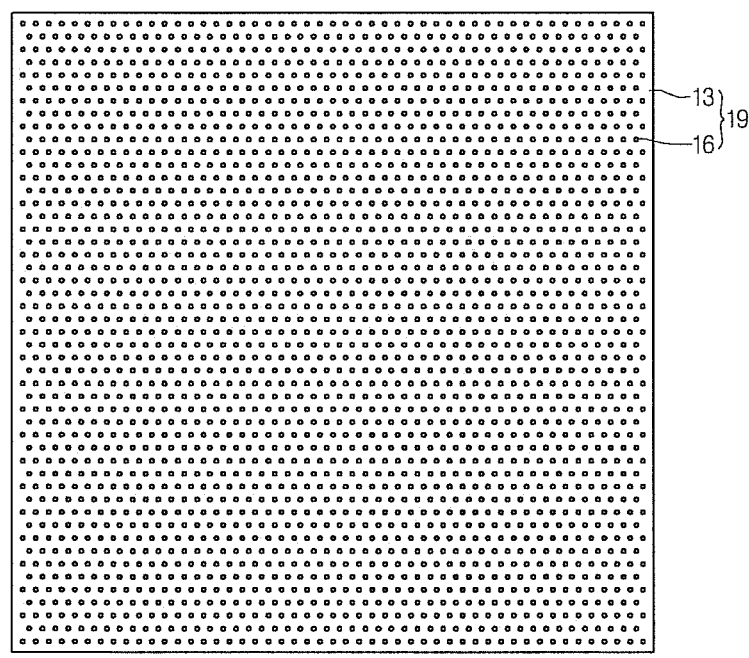
FIG. 2 is a plan view showing one example of a nano-structure of a light emitting device shown in FIG. 1.

As shown in FIG. 2, the nano-structure 19 may include a graphene layer 13 and a nano-texture 16 disposed on the graphene layer 13. The graphene layer 13 may be formed on the entire region of the substrate 10 in the form of a plate shape.

The graphene layer 13 may be formed through various processes. For example, the graphene layer 13 may be formed through a chemical synthesis scheme based on an oxidation-reduction for graphite, a CVD growing scheme, and an epitaxial growth scheme.

The graphene layer 13 includes graphene that has the thinnest thickness among materials, which are known until now, can most excellently conduct electricity or heat, includes the most flexible material, and may be extended or bent with the superior elasticity. In addition, the graphene layer 13 may have a transmittance function to transmit light.

After the graphene layer 13 has been previously formed, the graphene layer 13 may be attached onto the substrate 10. Alternatively, the graphene layer 13 may be directly formed on the substrate 10 through a chemical synthesis scheme, a CVD growing scheme, and an epitaxial growth scheme.

A plurality of nano-textures 16 may be formed on the graphene layer 13. In order to grow the nano-textures 16 on the graphene layer 13, a seed layer (not shown) may be formed under the nano-texture 16.

The nano-texture 16 may include a zinc oxide (ZnO), but the embodiment is not limited thereto.

The lattice constant of the nano-texture 16, for example, the lattice constant of ZnO is about 3.25. The lattice constant of the substrate 10, for example, the lattice constant of the sapphire substrate is about 4.78, and the lattice constant of the compound semiconductor such as GaN that may be used for the light emitting structure 30 is about 3.18.

Accordingly, since the lattice constant of ZnO has an intermediate value between the lattice constant of the sapphire substrate and the lattice constant of GaN, the GaN may be sufficiently grown on a sapphire substrate without the dislocation thereof due to ZnO.

The nano-texture 16 may include a plurality of nano-rods. The nano-rods may be spaced apart from each other by a uniform interval, or by an irregular interval.

The height H1 of the nano-texture 16 may be different from a width W1. For example, the height H1 of the nano-texture 16 may be higher than the width W1, but the embodiment is not limited thereto.

The width W1 of the nano-texture 16 may be in the range of 5 nm to 500 nm, for example, in the range of 50 nm to 200 nm. The height H1 of the nano-texture 16 may be in the range of 10 nm to 3 μm, for example, in the range of 500 nm to 1 μm.

The height H1 of the nano-texture 16 may be higher than the width W1 of the nano-texture 16. In this case, a semiconductor such as the buffer layer or the light emitting structure 30, for example, a semiconductor such as GaN may be grown in a vertical direction in a region between the nano-textures 16, and may be grown in a vertical direction or a horizontal direction on the nano-texture 16. Accordingly, the dislocation may not occur in the compound semiconductor, and a semiconductor layer having superior crystallinity may be disposed, thereby improving the electrical and optical characteristics of the light emitting device.

When the light emitting structure 30 is formed on the nano-structure 19, the light emitting structure 30 may be formed in a region between the nano-textures 16 and on the nano-texture 16. In other words, the semiconductor layers of the light emitting structure 30 may be laminated on the nano-structure 19.

The light emitting structure 30 may include the first conductive semiconductor layer 25, the active layer 27, and the second conductive semiconductor layer 29. The first conductive semiconductor layer 25 may be formed at the upper portion of the buffer layer or the nano-structure 19, the active layer 27 may be formed on the first conductive semiconductor layer 25, and the second conductive semiconductor layer 29 may be formed on the active layer 27.

The first conductive semiconductor layer 25 may be formed on the nano-structure 19. In detail, the first conductive semiconductor layer 25 is formed in a vertical direction from the graphene layer 13 between the nano-textures 16 of the nano-structure 19, and formed in vertical and horizontal directions from the top surface of the nano-texture 16. Accordingly, the first conductive semiconductor layer 25 may formed on the nano-texture 16.

In addition, the first conductive semiconductor layer 25 may have a thickness thicker than that of the nano-texture 16. The first conductive semiconductor layer 25 of the light emitting structure 30 may have a thickness in the range of 2 μm to 3 μm, but the embodiment is not limited thereto.

Therefore, since the first conductive semiconductor layer 25 has the thickness greater than the height of the nano-texture 16, the first conductive semiconductor layer 25 may be formed in the region between the nano-textures 16 of the nano-structure 19 and on the nano-textures 16.

For example, the first conductive semiconductor layer 25 may include an N type semiconductor layer including N type dopants. The N type semiconductor layer includes a semiconductor material having a composition formula of $In_xAl_yGa_{1-x-y}N$ ($0 \leq x \leq 1$, $0 \leq y \leq 1$, $0 \leq x+y \leq 1$). For example, the N type semiconductor layer may include at least one of InAlGaN, GaN, AlGaN, InGaN, AlN, InN and AlInN, and may be doped with N type dopants such as Si, Ge, and Sn.

The active layer 27 may be faulted on the first conductive semiconductor layer 25. The active layer 27 may generate light having a wavelength corresponding to the energy bandgap difference varied depending on a material constituting the active layer 27 through the recombination of first carriers (e.g., electrons), which are injected through the first conductive semiconductor layer 27, and second carriers (e.g., holes) injected through the second conductive semiconductor layer 29.

The active layer 27 may include one of a multi quantum well (MW) structure, a quantum dot structure, or a quantum wire structure. The active layer 27 may be formed by repeatedly laminating group II to VI compound semiconductors at a cycle of a well layer and a barrier layer. For example, the active layer 27 may be formed at a cycle of InGaN well layer/GaN barrier layer, a cycle of InGaN well layer/AlGaN barrier layer, or a cycle of InGaN well layer/InGaN barrier layer. The bandgap of the barrier layer may be greater than the bandgap of the well layer.

The second conductive semiconductor layer 29 may formed on the active layer 27. For example, the second conductive semiconductor layer 29 may include a P type semiconductor layer including P type dopants. The P type semiconductor layer may include a semiconductor material having a composition formula of $In_xAl_yGa_{1-x-y}N$ ($0 \leq x \leq 1$, $0 \leq y \leq 1$, and $0 \leq x+y \leq 1$). For example, the P type semiconductor layer may include at least one selected from the group consisting of InAlGaN, GaN, AlGaN, InGaN, AlN, InN and AlInN, and may be doped with P type dopants such as Mg, Zn, Ca, Sr, and Ba.

In addition, another layer may be additionally formed between the active layer 27 and the first conductive semiconductor layer 25, or between the active layer 27 and the second conductive semiconductor layer 29, but the embodiment is not limited thereto.

Figure 3:
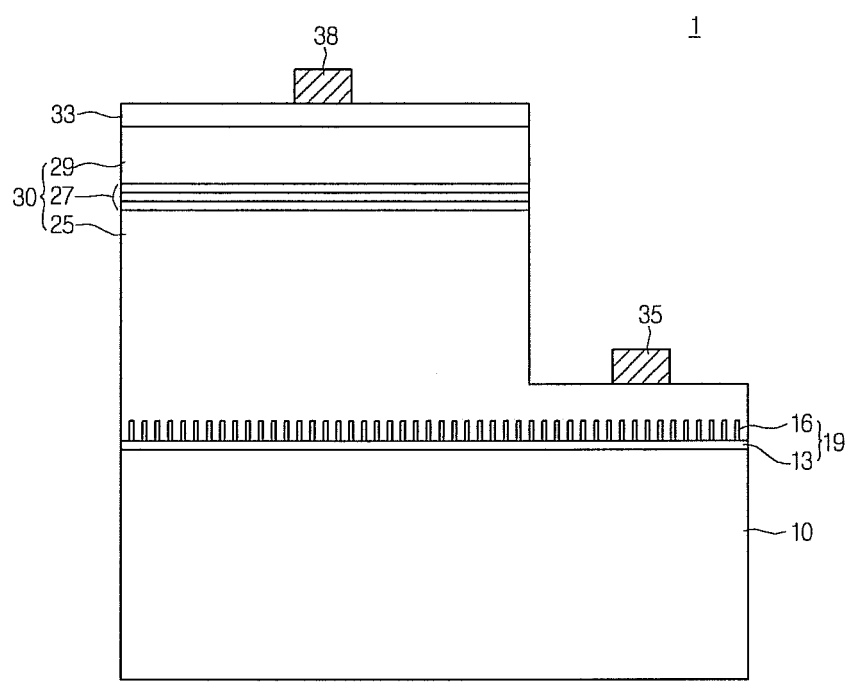
FIG. 3 is a sectional view showing a lateral-type light emitting device according to a first embodiment.

FIG. 3 is a sectional view showing a lateral-type light emitting device according to the first embodiment. The first embodiment employs the light emitting structure of FIG. 1 except for the transparent conductive layer 33 and the first and second electrodes 35 and 38. Therefore, in the first embodiment, the same reference numerals will be assigned to elements having the same shapes or functions as those of the light emitting device of FIG. 1, and details thereof will be omitted. The elements having no description in the first embodiment may be comprehended from the description of the light emitting device of FIG. 1 by those skilled in the art.

Referring to FIG. 3, the lateral-type light emitting device according to the first embodiment may include the substrate 10, the nano-structure 19, the light emitting structure 30, the transparent conductive layer 33, and the first and second electrodes 35 and 38, but the embodiment is not limited thereto.

Since the substrate 10, the nano-structure 19, and the light emitting structure 30 have been described in detail, the details thereof will be omitted.

The transparent conductive layer 33 may be formed on the second conductive semiconductor layer 29 of the light emitting structure 30, and the second electrode 38 may be formed on a portion of the transparent conductive layer 33.

The first electrode 35 may be formed on a portion of the first conductive semiconductor layer 25 of the light emitting structure 30. To this end, the second conductive semiconductor layer 29 and the active layer 27 may be removed through a mesa etching process, and a portion of the top surface of the first conductive semiconductor layer 25 may be removed. The first electrode 35 may be formed on the first conductive semiconductor layer 25 that is partially removed.

The second electrode 38 is formed on the upper most part of a light emitting device 1, and the first electrode 35 is formed on a lateral side of the light emitting device 1. If power is applied to the first and second electrodes 35 and 38, since current flows through the light emitting structure 30 corresponding to the shortest path between the first and second electrodes 35 and 38, light may not be generated through the entire region of the active layer 27 of the light emitting structure 30.

Accordingly, the transparent conductive layer 33 may be formed on the entire region of the second conductive semiconductor layer 29 while being disposed between the second conductive semiconductor layer 29 and the second electrode 38. Current is spread and supplied to the entire region of the transparent conductive layer 33 through the second electrode 38 and flows to the first electrode 35 and the transparent conductive layer 33, so that light is generated from the entire region of the active layer 27 of the light emitting structure 30. Therefore, the light emission efficiency can be improved.

The first and second electrodes 35 and 38 may include the same electrode material or materials different from each other.

The first and second electrodes 35 and 38 may include an opaque metallic material. For example, the first and second electrodes 35 and 38 may include one selected from the group consisting of aluminum (Al), titanium (Ti), chrome (Cr), nickel (Ni), platinum (Pt), gold (Au), tungsten (W), copper (Cu) and molybdenum (Mo), or the alloy thereof, but the embodiment is not limited thereto.

The transparent conductive layer 33 may include a conductive material representing superior transmittance to transmit light and electrical conductivity. For example, the transparent conductive layer 33 may include at least one selected from the group consisting of ITO, IZO (In—ZnO), GZO (Ga—ZnO), AZO (Al—ZnO), AGZO (Al—GaZnO), IGZO (In—GaZnO), IrOx, RuOx, RuOx/ITO, Ni/IrOx/Au and Ni/IrOx/Au/ITO.

As the interval between the first electrode 35 and the nano-structure 19 is reduced, superior performance is represented. For example, the interval between the first electrode 35 and the nano-structure 19 may be in the range of 300 nm to 3000 nm, in detail, the range of 500 nm to 1000 nm. If the first electrode 35 and the nano-structure 19 represent a narrow interval therebetween, the current supplied to the first electrode 35 may flow to the nano-structure 19, and the current supplied to the nano-structure 19 may be spread to the entire region of the nano-structure 19. In this case, since the nano-structure 19 faces the transparent conductive layer 33, current may be supplied to the entire region of the active layer 27 of the light emitting structure 30 between the transparent conductive layer 33 and the nano-structure 19. Therefore, since the light is generated from the entire region of the active layer 27, the light emission efficiency can be improved.

Therefore, the nano-structure 19 may have a current spreading function.

In addition, the nano-structure 19 may serve as an electron blocking layer. Typically, although the electrons generated from the first conductive semiconductor layer 25 are supplied to the active layer 27, a portion of the electrons may be supplied to the substrate 10. Due to the electrons moving to the substrate 10, current leaks to degrade the light emission efficiency of the light. The nano-structure 19 according to the embodiment serves as a current spreading layer, and the current spreading layer may block the electrons, which are generated from the first conductive semiconductor layer 25, from being supplied to the substrate 10.

Therefore, according to the embodiment, since the nano-structure 19 performs a current spreading function and an electron blocking layer, the light emission efficiency of the light emitting device can be remarkably improved.

Figure 4:
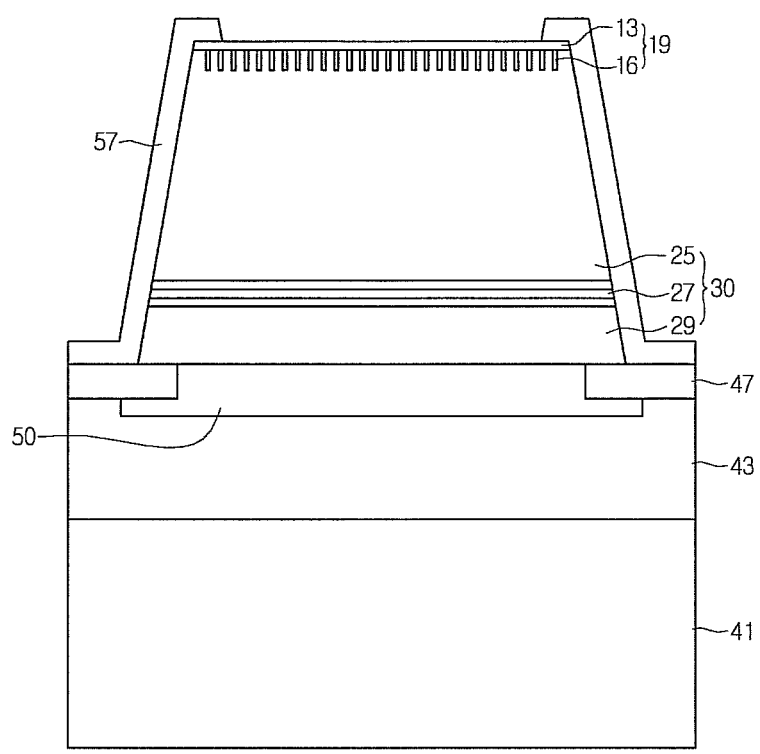
FIG. 4 is a sectional view showing a vertical-type light emitting device according to the second embodiment.

FIG. 4 is a sectional view showing a vertical-type light emitting device according to the second embodiment. Since the nano-structure 19 and the light emitting structure 30 according to the second embodiment are substantially the same as those of the light emitting device of FIG. 1, the same reference numerals are assigned to the nano-structure 19 and the light emitting structure 30, and the details thereof will be omitted.

Referring to FIG. 4, a vertical-type light emitting device according to the second embodiment may include a support substrate 41, a bonding layer 43, an electrode layer 50, a channel layer 47, a light emitting structure 30, a nano-structure 19, and a protective layer 57.

The support substrate 41, the bonding layer 43, and the electrode layer 50 may constitute an electrode member to supply power.

The support substrate 41 may support a plurality of layers formed thereon and serve as an electrode. The support substrate 41 may supply power to the light emitting structure 30 together with the nano-structure 19.

The support substrate 41 may include a metallic material or a semiconductor material, but the embodiment is not limited thereto. The support substrate 41 may include a material representing higher electrical conductivity and higher thermal conductivity. For example, the support substrate 41 may include a metallic material including at least one selected from the group consisting of titanium (Ti), chrome (Cr), nickel (Ni), aluminum (Al), platinum (Pt), gold (Au), tungsten (W), copper (Cu), a copper alloy (Cu Alloy), molybdenum (Mo) and copper-tungsten (Cu—W). For example, the support substrate 41 may include a semiconductor material including at least one selected from the group consisting of Si, Ge, GaAs, GaN, ZnO, SiGe, and SiC.

The support substrate 41 is plated or deposited under the light emitting structure 30. Alternatively, the support substrate 41 may be attached under the light emitting structure 30 in the form of a sheet, but the embodiment is not limited thereto.

The bonding layer 43 may be formed on the support substrate 41. The bonding layer 43 is disposed between the electrode layer 50 and the support substrate 41. The bonding layer 43 may serve as a medium to enhance bonding strength between the electrode layer 50 and the support substrate 41.

The bonding layer 43 may include barrier metal or bonding metal. The bonding layer 43 may include a metallic material representing higher adhesive property and higher thermal conductivity. The bonding layer 43 may include at least one selected from the group consisting of Ti, Au, Sn, Ni, Nb, Cr, Ga, In, Bi, Cu, Ag and Ta.

A barrier layer, which is not shown, may be formed on the bonding layer 43. The barrier layer may prevent materials constituting the bonding layer 43 and the support substrate 41, which are formed under the barrier layer, from being spread to the electrode layer 50 and the light emitting structure 30, which are formed above the barrier layer, to spread the characteristic of the light emitting device. The barrier layer may include a single layer selected from the group consisting of Ni, Pt, Ti, W, V, Fe and Mo, or may have the lamination structure of at least two layers including the above materials. The barrier layer may contact with the bottom surface of the electrode layer 50.

The top surface of the bonding layer 43 may have a groove, a peripheral region of which may extend upward of the central region thereof, that is, may extend to the light emitting structure 30, but the embodiment is not limited thereto. The electrode layer 50 may contact with the central region of the top surface of the bonding layer 43 or may be formed in the groove, but the embodiment is not limited thereto. Although not shown, in the top surface of the bonding layer 43, the central region and the peripheral regions may be located in the same line or the same horizontal plane. In other words, the entire region of the top surface of the bonding layer 43 may have a flat surface. In this case, the electrode layer 50 may be formed at the central region of the top surface of the bonding layer 43 or may be formed on the entire region of the top surface of the bonding layer 43.

The size of the electrode layer 50 may be smaller than or equal to the size of the bonding layer 43. The top surface of the electrode layer 50 and the top surface of the channel layer 47 may be formed on the same line.

The bottom surface of the electrode layer 50 may be formed in a position different from that of the bottom surface of the channel layer 47. In other words, since the electrode layer 50 is formed on the central region of the bonding layer 43 having the groove therein, and the channel layer 47 is formed on the peripheral region of the bonding layer 43, the bottom surface of the electrode layer 50 may be formed in a position lower than that of the bottom surface of the channel layer 47.

A portion of the electrode layer 50 may overlap with the bottom surface of the channel layer 47 in a vertical direction. In other words, the inner region of the channel layer 47 may extend inward of the end of the electrode layer 50.

The electrode layer 50 reflects light incident from the light emitting structure 30 to improve the light extraction efficiency. The electrode layer 50 makes ohmic contact with the light emitting structure 30, so that current may flow through the light emitting structure 30. Although not shown, the electrode layer 50 may include a reflective layer making contact with the top surface of the bonding layer 43 and an ohmic contact layer formed between the top surface of the reflective layer and the bottom surface of the light emitting structure 30.

The electrode layer 50 may include a single layer including the mixture of the reflective material and the ohmic contact material. In the electrode layer 50, the reflective layer may not be faulted separately from the ohmic contact layer. For example, the reflective material includes at least one selected from the group consisting of Ag, Ni, Al, Rh, Pd, Ir, Ru, Mg, Zn, Pt, Au and Hf, or the alloy thereof, but the embodiment is not limited thereto. The ohmic contact material may include a transparent conductive material. For example, the ohmic contact material may include at least one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IrOx, RuOx, RuOx/ITO, Ni, Ag, Ni/IrOx/Au, and Ni/IrOx/Au/ITO.

The electrode layer 50 may have a multiple layer including one of IZO/Ni, AZO/Ag, IZO/Ag/Ni, and AZO/Ag/Ni.

The electrode layer 50 may make ohmic contact with at least the light emitting structure 30. Accordingly, current is smoothly supplied to the light emitting structure making ohmic contact with the electrode layer 50, so that the light emission efficiency can be improved.

The electrode layer 50 may overlap with the bottom surfaces of the light emitting structure 30 and the channel layer 47. In order to reflect the entire portion of light from the light emitting structure 30, the width of the electrode layer 50 may be wider than that of at least the light emitting structure 30, especially, the active layer 27.

The channel layer 47 may be formed on the electrode layer 50. The channel layer 47 may be formed along the peripheral region of the second conductive semiconductor layer 29. The channel layer 47 may be formed along the peripheral portion of the edge region of the electrode layer 50. In other words, the channel layer 47 may be formed at the peripheral region between the light emitting structure 30 and the electrode layer 50. In detail, at least a portion of the channel layer 47 is surrounded by the electrode layer 50 and the light emitting structure 30. For example, a portion of the top surface of the channel layer 47 may contact with the second conductive semiconductor layer 29, and the inner lateral side and a portion of the bottom surface of the channel layer 47 may contact with the electrode layer 50, but the embodiment is not limited thereto. An opposite portion of the bottom surface of the channel layer 47 may contact with the peripheral region of the top surface of the bonding layer 43.

The channel layer 47 may prevent the electrical short between the lateral side of the bonding layer 43 and the lateral side of the light emitting structure 30 caused by external materials. If the electrode layer 50 is formed on the entire region of the bonding layer 43, so that the outer lateral side of the electrode layer 50 is exposed to the outside, the channel layer 47 may prevent the electrical short between the lateral side of the electrode layer 50 and the lateral side of the light emitting structure 30.

In addition, the channel layer 47 ensures the contact area with the light emitting structure 30 as widely as possible, thereby effectively preventing the light emitting structure 30 from being delaminated from the electrode layer 50 when performing a laser scribing process to separate a plurality of chips into individual chips and a laser lift off (LLO) process to remove the substrate.

When the light emitting structure 30 is over-etched in the chip separation process, the electrode layer 50 may be exposed. In this case, the electrical short between the electrode layer 50 and the active layer 27 of the light emitting structure 30 may be caused by the foreign matters at the outer region of the light emitting device. The channel layer 47 can prevent the electrode layer 50 from being exposed due to the over-etching of the light emitting structure 30 in the chip separation process.

The channel layer 47 may include an insulating material. For example, the channel layer 47 may include at least one selected from the group consisting of $SiO_2$, SiOx, SiOxNy, $Si_3N_4$, and $Al_2O_3$. The channel layer 47 may include a metallic material, but the embodiment is not limited thereto.

The light emitting structure 30 may be formed on the electrode layer 50 and the channel layer 47.

The lateral side of the light emitting structure 30 may be perpendicularly or inclined in the etching process to separate a plurality of chips into individual chips. For example, the lateral side of the light emitting structure 30 may be formed through an isolation etching process.

The light emitting structure 30 may include a plurality of compound semiconductor materials including group II to V elements. The light emitting structure 30 may include the second conductive semiconductor layer 29, the active layer 27 on the second conductive semiconductor layer 29, and the first conductive semiconductor layer 25 on the active layer 27.

In this case, the bottom surface of the second conductive semiconductor layer 29 may contact with the top surface of the electrode layer 50 and the top surface of the channel layer 47, but the embodiment is not limited thereto.

Accordingly, in order to reflect the entire portion of light generated from the active layer 27, the width of the active layer 27 may be narrower than the width of the electrode layer 50.

The channel layer 47 may include a first channel region overlapping with the second conductive semiconductor layer 29 in a vertical direction and a second channel region that does not overlap with the second conductive semiconductor layer 29. The first channel region extends inward of the end of the second conductive semiconductor layer 29 and overlaps with the second conductive semiconductor layer 29 in the vertical direction. The second channel region may extend from the first channel region onto the outer peripheral portion of the bonding layer 43.

When the light emitting structure 30 is grown, the light emitting structure 30 may be grown in order of the first conductive semiconductor layer 25, the active layer 27, and the second conductive semiconductor layer 29. The nano-structure 19 may be formed on the light emitting structure 30, for example, on the first conductive semiconductor layer 25.

The nano-structure 19 may include the graphene layer 13 formed on the entire region of the top surface of the first conductive semiconductor layer 25 and a plurality of nano-textures 16 from the bottom surface of the graphene layer 13 into the first conductive semiconductor layer 25, but the embodiment is not limited thereto.

The graphene layer 13 may have the form of a plate shape formed on the entire region of the first conductive semiconductor layer 25. The nano-textures 16 may include ZnO, but the embodiment is not limited thereto. The nano-texture 16 grows the light emitting structure 30 with superior crystallinity without dislocation.

The nano-texture 16 may include a plurality of nano-rods, but the embodiment is not limited thereto. The nano-rods may be spaced apart from each other by a uniform interval, or by an irregular interval. The nano-texture 16 may have the structure, the height of which is greater than the width thereof, but the embodiment is not limited thereto. Since the details of the nano-texture 16 has been described in terms of the height or the width, the details of the nano-texture 16 according to the present embodiment will be omitted.

Figure 5:
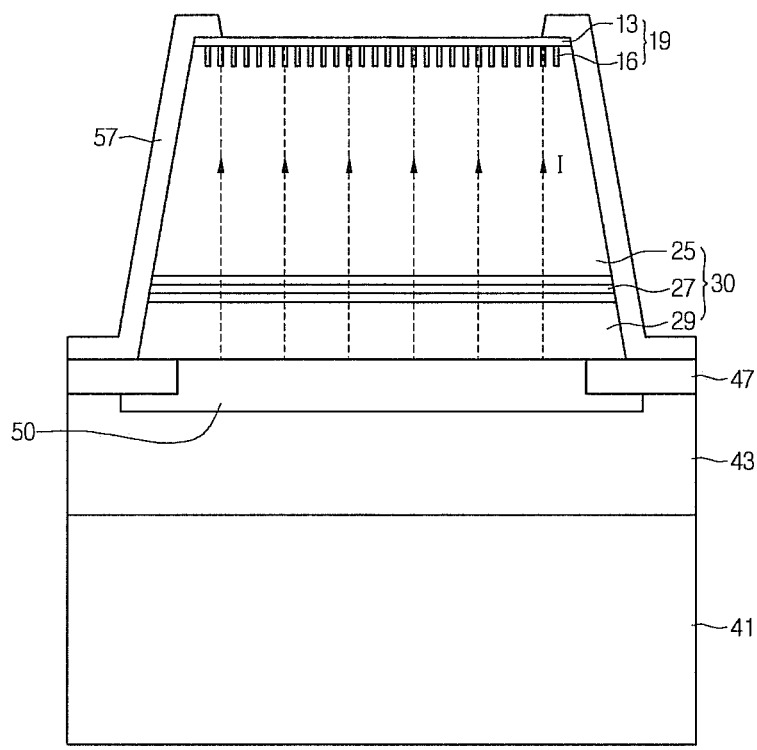
FIG. 5 is a sectional view showing the current flow in the vertical-type light emitting device shown in FIG. 4.

The nano-structure 19 may have a current spreading function. In other words, as shown in FIG. 5, the graphene layer 13 of the nano-structure 19 is formed on the entire region of the first conductive semiconductor layer 25, and the graphene layer 13 faces the electrode layer 50. If power is supplied to the nano-structure 19 and the support substrate 41, current is supplied to the entire region of the active layer 27 between the graphene layer 13 and the electrode layer 50, so that the light is generated from the entire region of the active layer 27. Accordingly, the light emission efficiency can be improved.

The protective layer 57 may be formed on the light emitting structure 30. For example, the protective layer 57 may be formed on at least the lateral side of the light emitting structure 30. In detail, one end of the protective layer 57 may be formed at the peripheral region of the top surface of the first conductive semiconductor layer 25, and an opposite end of the protective layer 57 may be formed at a portion of the top surface of the channel layer 47 while passing through or traversing the lateral side of the first conductive semiconductor layer 25, the lateral side of the active layer 27, and the lateral side of the second conductive semiconductor layer 29, but the embodiment is not limited thereto.

The protective layer 57 may prevent the electrical short between the light emitting structure 30 and the support substrate 41 while protecting the light emitting device from external shock. The protective layer 57 may include a material representing superior transparency and an insulating property. For example, the protective layer 57 may include one selected from the group consisting of $SiO_2$, $SiO_x$, $SiO_xN_y$, $Si_3N_4$, $TiO_2$ and $Al_2O_3$, but the embodiment is not limited thereto.

Although the protective layer 57 may include a material the same as that of the channel layer 47, the embodiment is not limited thereto.

FIGS. 6 to 12 are sectional views showing the process of fabricating the vertical-type light emitting device according to the second embodiment.

Figure 6:
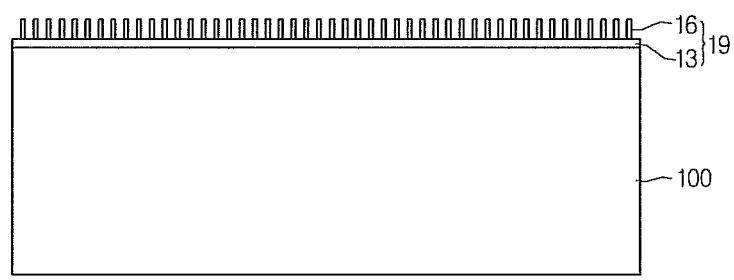
FIG. 6 is a sectional view showing the nano-structure formed on a substrate in a process of fabricating the light emitting device shown in FIG. 5.

Referring to FIG. 6, the nano-structure 19 may be formed on a growth substrate 100.

The growth substrate 100 is a substrate to grow the light emitting structure 30. The growth substrate 100 may include a material suitable for the growth of a semiconductor material, that is, a carrier wafer. In addition, the growth substrate 100 may include a material representing having a lattice constant approximate to the lattice constant of the light emitting structure 30 and representing thermal stability. The growth substrate 100 may include a conductive substrate or an insulating substrate. The growth substrate 100 may include at least one selected from the group consisting of sapphire ($Al_2O_3$), SiC, Si, GaAs, GaN, ZnO, Si, GaP, InP, and Ge.

The nano-structure 19 may include the graphene layer 13 and a plurality of nano-textures 16. The graphene layer 13 is previously formed and attached onto the growth substrate 100. Alternatively, for example, the graphene layer 13 may be formed on the growth substrate 100 through a chemical synthesis scheme, a CVD growing scheme, and an epoxy growth scheme.

The graphene layer 13 may be formed on the entire region of the growth substrate 100. Thereafter, a plurality of nano-textures 16 may be formed on the graphene layer 13. The nano-textures 16 may be formed on the graphene layer 13 through a deposition process or a growing process using ZnO.

For example, the nano-texture 16 may be formed through a CVD growing scheme or a sputtering scheme, but the embodiment is not limited thereto. The nano-textures 16 may be formed at a uniform interval, or at an irregular interval on the graphene layer 13. Accordingly, the nano-structure 19 may be formed by the graphene layer 13 and the nano-textures 16.

Figure 7:
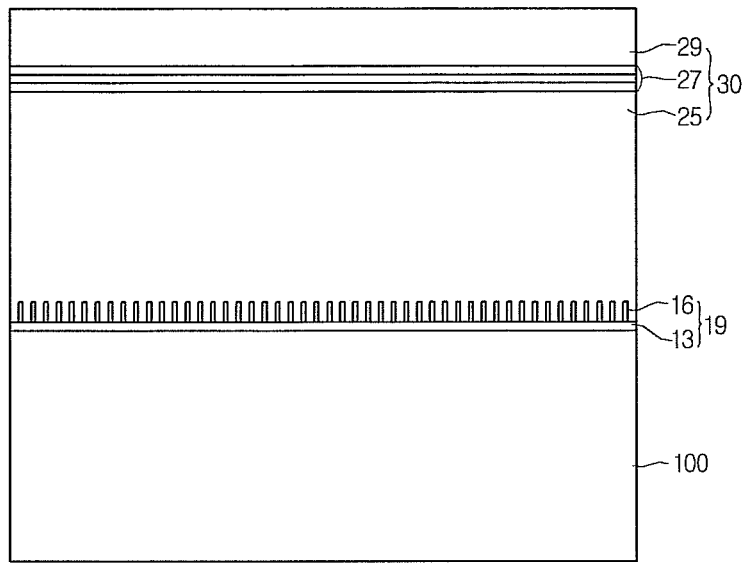
FIG. 7 is a sectional view showing a light emitting structure formed on the nano-structure shown in FIG. 6.

Referring to FIG. 7, the first conductive semiconductor layer 25, the active layer 27, and the second conductive semiconductor layer 29 may be sequentially grown on the nano-structure 19, thereby forming the light emitting structure 30.

For example, the light emitting structure 30 may be formed through an MOCVD (Metal Organic Chemical Vapor Deposition), a CVD (Chemical Vapor Deposition), a PECVD (Plasma-Enhanced Chemical Vapor Deposition), an MBE (Molecular Beam Epitaxy), or an HVPE (Hydride Vapor Phase Epitaxy), but the embodiment is not limited thereto.

A buffer layer (not shown) may be formed between the light emitting structure 30 and the growth substrate 100 to reduce the lattice constant difference therebetween. In other words, the buffer layer may be grown on the nano-structure 19, and the light emitting structure 30 may be grown on the buffer layer.

The first conductive semiconductor layer 25 may be formed on the growth substrate 100. The first conductive semiconductor layer 25 may be an N type semiconductor layer including N type dopants.

In detail, the first conductive semiconductor layer 25 may be grown in a vertical direction from the graphene layer 13 in a region between the nano-textures 16 of the nano-structure 19, or may be grown in the vertical direction or a horizontal direction from the top surface of the nano-texture 16, so that the first conductive semiconductor layer 25 may be formed in the region between the nano-textures 16 and on the nano-texture 16.

The lattice constant of ZnO is about 3.25, the lattice constant of the sapphire substrate serving as the growth substrate 100 is about 4.78, and the lattice constant of GaN that may be used for the first conductive semiconductor layer 25 is about 3.18.

Accordingly, since the lattice constant difference between the first conductive semiconductor layer 25 and the nano-structure 19, in detail, the nano-texture 16 is less than the lattice constant difference between the first conductive semiconductor layer 25 and the growth substrate 100, the first conductive semiconductor layer 25 may be smoothly grown on the nano-structure 19 without dislocation.

The active layer 27 is formed on the first conductive semiconductor layer 25 and may include one of a multi quantum well (MQW) structure, a quantum dot structure, or a quantum wire structure, but the embodiment is not limited thereto.

The active layer 27 may generate light having a wavelength corresponding to the energy bandgap difference varied depending on a material constituting the active layer 27 through the recombination of electrons, which are injected through the first conductive semiconductor layer 27, and holes injected through the second conductive semiconductor layer 29.

The second conductive semiconductor layer 29 may be formed on the active layer 27. The second conductive semiconductor layer 29 may include a P type semiconductor layer including P type dopants.

Figure 8:
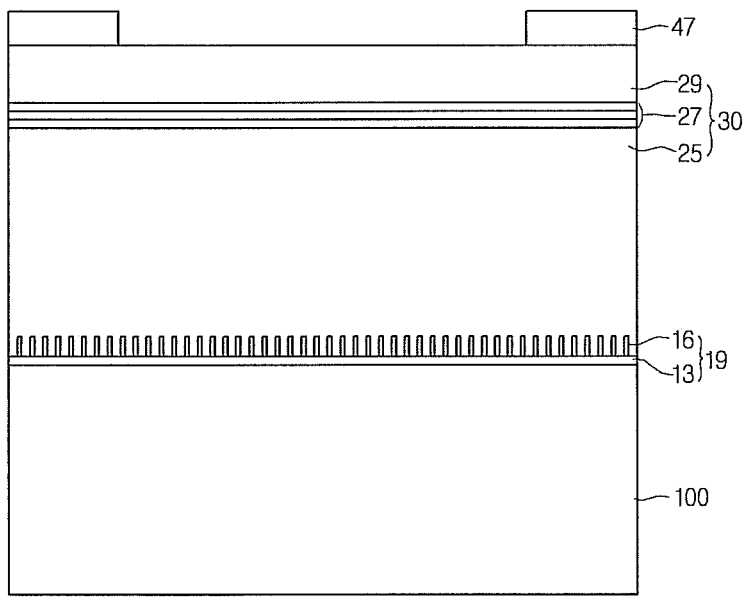
FIG. 8 is a sectional view showing the procedure of forming a channel layer on the light emitting structure shown in FIG. 7.

Referring to FIG. 8, the channel layer 47 may be formed on the second conductive semiconductor layer 29.

The channel layer 47 may be formed on the second conductive semiconductor layer 29. For example, the channel layer 47 may be formed at the peripheral region of the second conductive semiconductor layer 29, but the embodiment is not limited thereto.

The channel layer 47 may include an insulating material, for example, at least one selected from the group consisting of $SiO_2$, $SiO_x$, $SiO_xN_y$, $Si_3N_4$, and $Al_2O_3$.

Figure 9:
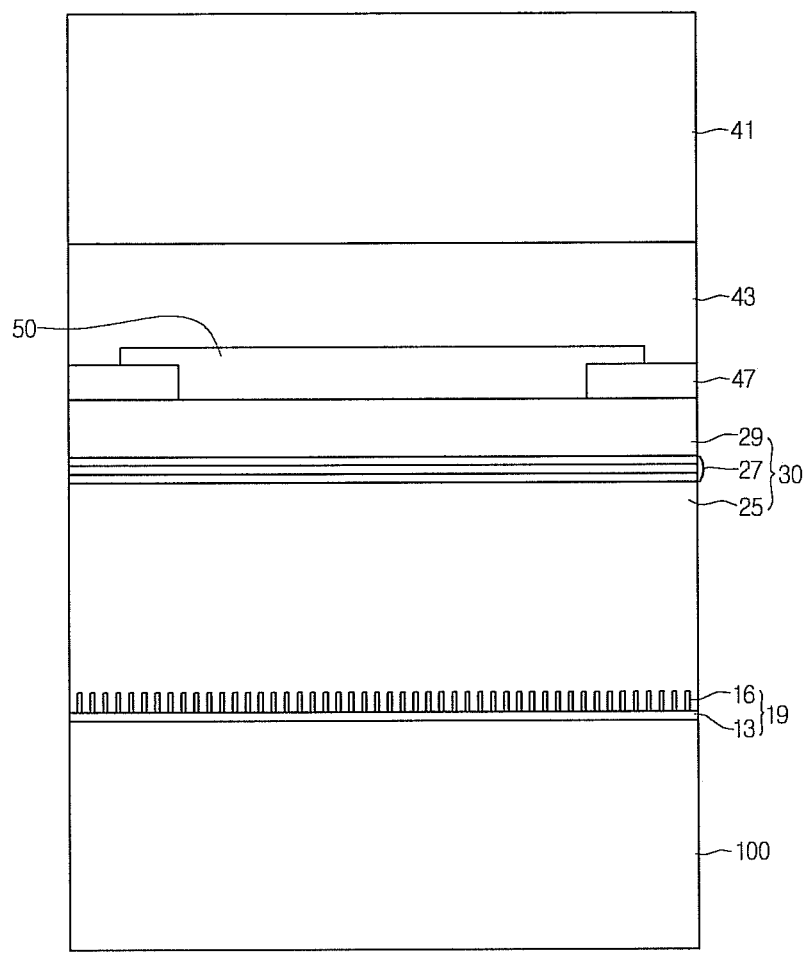
FIG. 9 is a sectional view showing the light emitting structure of FIG. 8 provided thereon with an electrode layer, a bonding layer, and a support substrate.

Referring to FIG. 9, the electrode layer 50, the bonding layer 43, and the support substrate 41 may be formed on the channel layer 47 and the second conductive semiconductor layer 29.

The electrode layer 50 may include an ohmic contact layer and a reflective layer sequentially laminated on the second conductive semiconductor layer 29.

The electrode layer 50 may include a single layer including the mixture of an ohmic contact material and a reflective material on the second conductive semiconductor layer 29. Since the ohmic contact material and the reflective material have been described, the details thereof will be omitted.

The bonding layer 43 may be formed to enhance the bonding strength between the support substrate 41 and the electrode layer 50. For example, the bonding layer 43 may include at least one selected from the group consisting of Ti, Au, Sn, Ni, Nb, Cr, Ga, In, Bi, Cu, Ag and Ta.

The support substrate 41 not only supports a plurality of layers, but also serves as an electrode. The support substrate 41 may supply power to the light emitting structure 30 together with the nano-structure 19.

The support substrate 41 may include at least one of Ti, Cr, Ni, Al, Pt, Au, W, Cu, Mo, and Cu—W.

The support substrate 41 is plated and/or deposited on the light emitting structure 30. Alternatively, the support substrate 41 may be attached on the light emitting structure 30 in the form of a sheet, but the embodiment is not limited thereto.

Figure 10:
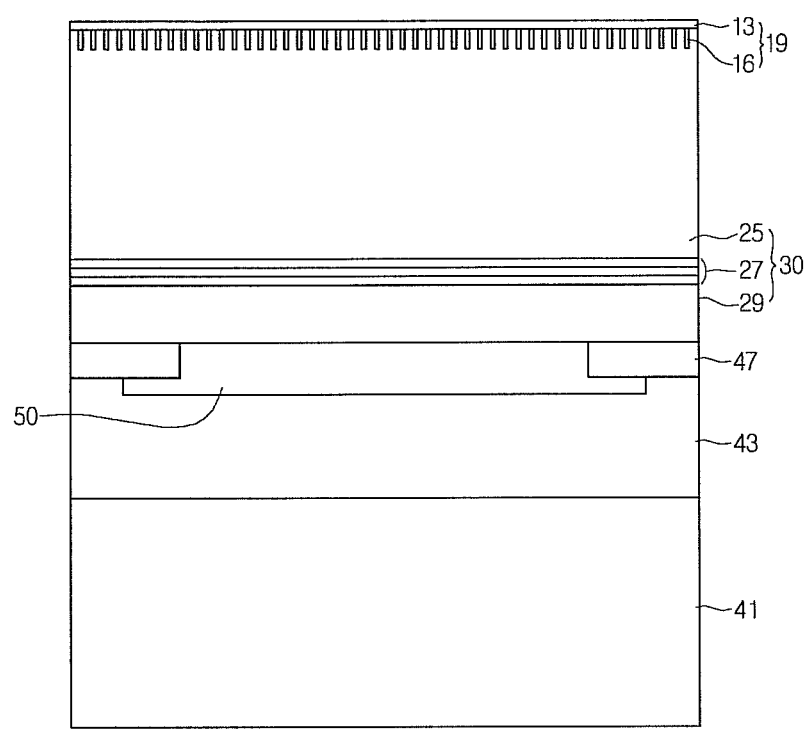
FIG. 10 is a sectional view showing the nano-structure shown in FIG. 9 having no substrate.

Referring to FIG. 10, after reversing the growth substrate 100 at 180°, the growth substrate 100 may be removed.

The growth substrate 100 may be removed through an LLO (Laser Lift Off) scheme, a CLO (Chemical Lift Off) scheme, or a physical polishing scheme, but the embodiment is not limited thereto.

When the growth substrate 100 is removed through the LLO scheme, the growth substrate 100 may be separated from the nano-structure 19 by concentratedly irradiating a laser to the interfacial surface between the growth substrate 100 and the first conductive semiconductor layer 25.

When the growth substrate 100 is removed through the CLO scheme, the growth substrate 100 may be removed by using a wet etching process to the extent that the first conductive semiconductor layer 25 is exposed.

When the growth substrate 100 is removed through the physical polishing scheme, the growth substrate 100 may be sequentially removed from the top surface thereof by directly polishing the growth substrate 100 to the extent that the first conductive semiconductor layer 25 is exposed.

According to the second embodiment, the nano-structure 19 is formed between the light emitting structure 30 and the growth substrate 100. Since the nano-structure 19 represents a weaker bonding strength with the growth substrate 100, the growth substrate 100 can be easily separated from the nano-structure 19 by irradiating a laser therebetween. In other words, the nano-structure 19 easily separates the growth substrate 100 from the light emitting structure 30. Therefore, the nano-structure 19 can prevent the defect such as a crack from being produced on the light emitting structure 30 due to the impact derived from laser power by irradiating a laser for a long time if the growth substrate 100 is not easily separated.

Figure 11:
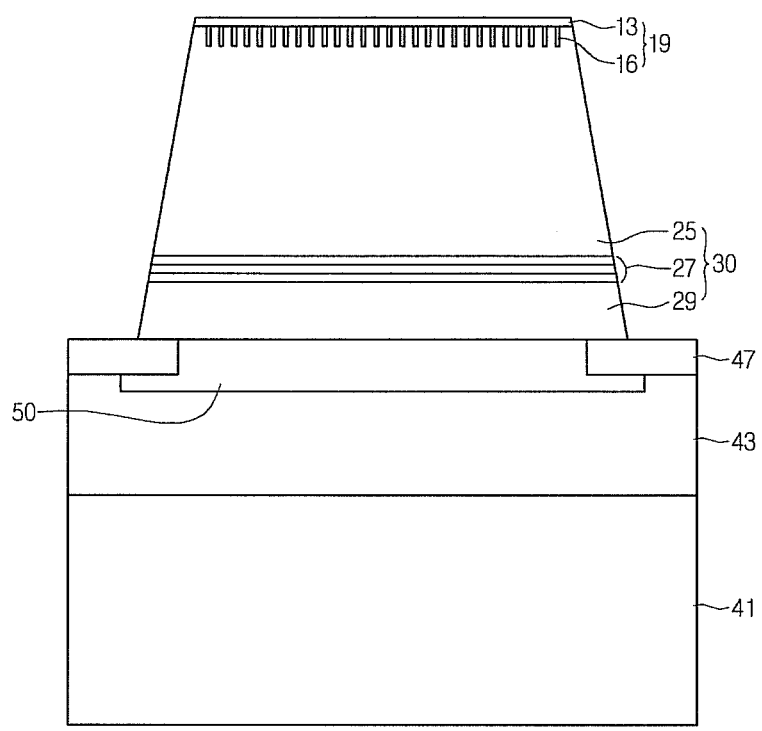
FIG. 11 is a sectional view showing that the peripheral portion of the light emitting structure shown in FIG. 10 is etched.

Referring to FIG. 11, a mesa etching process may be performed so that the lateral side of the light emitting structure 30 and the lateral side of the channel layer 47 are exposed while the lateral sides of the light emitting structure 30 and the channel layer 47 are inclined. Through the mesa etching process, the top surface of the channel layer 47 is disposed therein with a groove in which the light emitting structure 30 is not disposed. In other words, the groove may be formed by removing the second conductive semiconductor layer 29, the active layer 27, and the first conductive semiconductor layer 25 formed on the channel layer 47 through the mesa etching process.

Since the channel layer 47 serves as a stopper, the first conductive semiconductor layer 25, the active layer 27, and the second conductive semiconductor layer 29 at the outer region of the groove are partially removed through the mesa etching process, and the electrode layer 50, the bonding layer 43, and the support substrate 41 disposed under the channel layer 47 are not removed.

Figure 12:
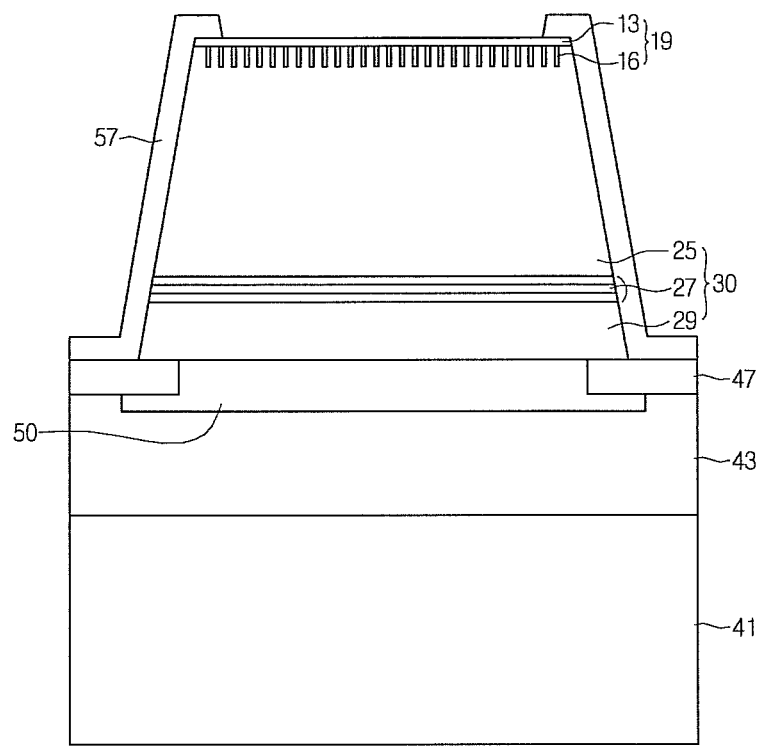
FIG. 12 is a sectional view showing a protective layer formed on the surface of the light emitting structure shown in FIG. 11.

Referring to FIG. 12, the protective layer 57 is formed on at least the light emitting structure 30.

In other words, the protective layer 57 may be formed from the light emitting structure 30, in detail, the peripheral portion of the top surface of the first conductive semiconductor layer 25 to a portion of the top surface of the channel layer 47 through the lateral side of the first conductive semiconductor layer 25, the lateral side of the active layer 27, and the lateral side of the second conductive semiconductor layer 29.

The protective layer 57 may prevent the electrical short between the light emitting structure 30 and the support substrate 41. The protective layer 57 may include a material representing superior transparency and a superior insulating property. For example, the protective layer 57 may include one selected from the group consisting of $SiO_2$, $SiO_x$, $SiO_xN_y$, $Si_3N_4$, $TiO_2$ and $Al_2O_3$, but the embodiment is not limited thereto.

The protective layer 57 may include a material the same as that of the channel layer 47

Figure 13:
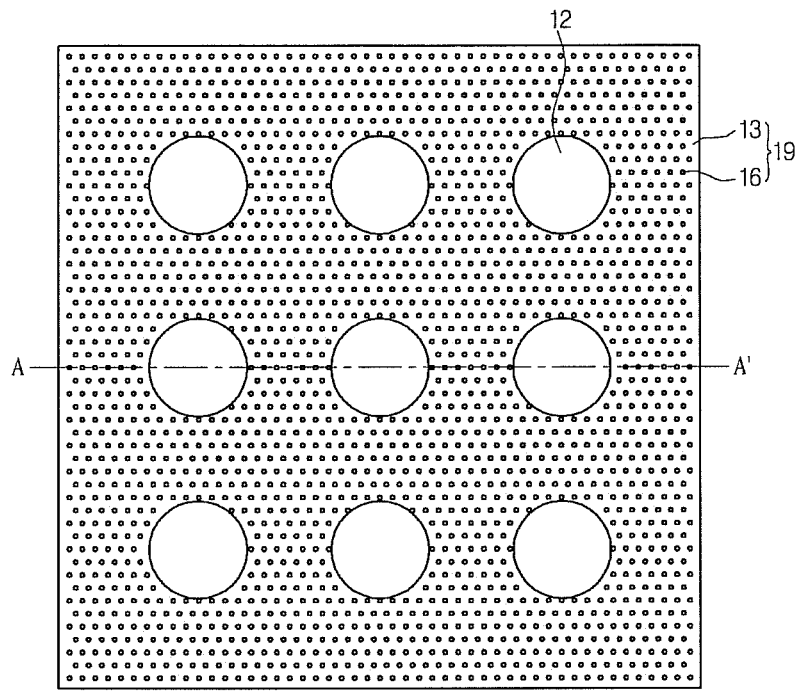
FIG. 13 is a sectional view showing another example of the nano-structure shown in FIG. 2.

FIG. 13 is a sectional view showing the nano-structure 19 of the light emitting device shown in FIG. 1 according to another embodiment.

Different from the nano-structure 19 shown in FIG. 1, the nano-structure 19 shown in FIG. 13 may have openings 12.

Those skilled in the art can easily comprehend the elements, which are not described in the following description, from the nano-structure 19 shown in FIG. 1.

The nano-structure 19 may include the graphene layer 13 having the form of a plate and the plural nano-textures 16 formed on the graphene layer 13.

A plurality of openings 12 may be formed in the graphene layer 13 while being spaced apart from each other by a predetermined distance. The openings 12 may be holes formed through the top surface and the bottom surface of the graphene layer 13, but the embodiment is not limited thereto.

Figure 14:
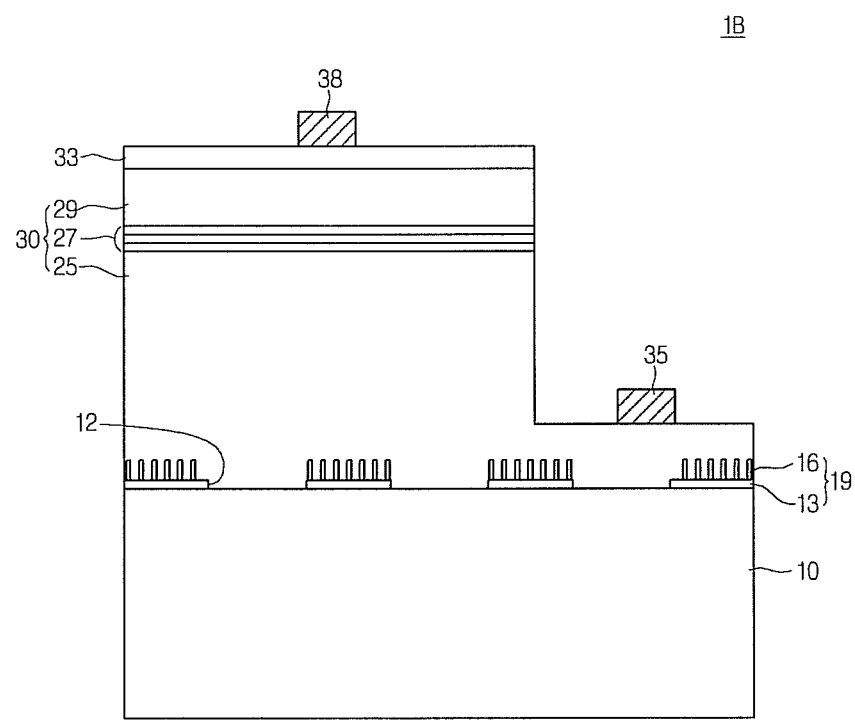
FIG. 14 is a sectional view showing a lateral-type light emitting device having the nano-structure shown in FIG. 13 according to a third embodiment.

FIG. 14 is a sectional view showing a lateral-type light emitting device having the nano-structure shown in FIG. 13 according to a third embodiment.

The third embodiment is substantially the same as the first embodiment (see FIG. 3) except that the nano-structure 19 shown in FIG. 13 is employed.

Referring to FIG. 14, the lateral-type light emitting device according to the third embodiment may include the substrate 10, the nano-structure 19, the light emitting structure 30, the transparent conductive layer 33, and the first and second electrodes 35 and 38, but the embodiment is not limited thereto.

The light emitting structure 30 may include the first conductive semiconductor layer 25 formed on the substrate 10, the active layer 27 formed on the first conductive semiconductor layer 25, and the second conductive semiconductor layer 29 formed on the active layer 27.

The first conductive semiconductor layer 25 may include an N type semiconductor layer, and the second conductive semiconductor layer 29 may include a P type semiconductor layer, but the embodiment is not limited thereto.

The nano-structure 19 may be formed on the substrate 10. The nano-structure 19 may include the graphene layer 13 formed on the entire region of the substrate 10 and the plural nano-textures 16 formed on the graphene layer 13.

The graphene layer 13 may include the openings 12. The openings 12 may be spaced apart from each other.

The opening 12 may have a circular shape as shown in FIG. 13, but the embodiment is not limited thereto. In other words, the opening 12 may have a square shape, a polygonal shape, an oval shape, or a bar-type shape.

The nano-texture 16 may include ZnO, but the embodiment is not limited thereto.

The nano-texture 16 may include a plurality of nano-rods, but the embodiment is not limited thereto. The nano-roads may be spaced apart from each other by a uniform interval or an irregular interval.

The nano-texture 16 may have the structure in which the height thereof is greater than the width thereof, but the embodiment is not limited thereto.

Since the detailed height and width of the nano-texture 16 have been described above, the details thereof will be omitted.

The first conductive semiconductor layer 25 may be formed on the nano-structure 19.

Although not shown, a buffer layer may be formed on the nano-structure 19, and the first conductive semiconductor layer 25 may be formed on the buffer layer, but the embodiment is not limited thereto.

The buffer layer or the first conductive semiconductor layer 25 may contact with the substrate 10 through the opening 12 of the nano-structure 19. In addition, the buffer layer or the first conductive semiconductor layer 25 may be disposed in the region between the nano-textures 16 or on the nano-textures 16.

If the thickness of the buffer layer is less than that of the nano-texture 16, the nano-texture 16 may be disposed in the first conductive semiconductor layer 25 through the buffer layer, but the embodiment is not limited thereto.

The first electrode 35 may be formed on a portion of the top surface of the first conductive semiconductor layer 25, and the second electrode 38 may be formed on a portion of the top surface of the transparent conductive layer 33.

As the interval between the first electrode 35 and the nano-structure 19 is reduced, superior performance is represented. If the first electrode 35 and the nano-structure 19 represent a narrow interval therebetween, the current may flow from the first electrode 35 to the nano-structure 19, and the current supplied to the nano-structure 19 may be spread to the entire region of the nano-structure 19 when power is applied to the first and second electrodes 35 and 38. In this case, since the nano-structure 19 faces the transparent conductive layer 33, current may be supplied to the entire region of the active layer 27 of the light emitting structure 30 between the transparent conductive layer 33 and the nano-structure 19. Therefore, since the light is generated from the entire region of the active layer 27, the light emission efficiency can be improved. The nano-structure 19 may serve as a current spreading layer.

In addition, the nano-structure 19 may serve as an electron blocking layer. Typically, although the electrons generated from the first conductive semiconductor layer 25 are supplied to the active layer 27, a portion of the electrons may be supplied to the substrate 10. Due to the electrons moving to the substrate 10, current leaks to degrade the light emission efficiency of the light.

The nano-structure 19 according to the embodiment serves as a current spreading layer, and the current spreading layer may block the electrons, which are generated from the first conductive semiconductor layer 25, from being supplied to the substrate 10.

Therefore, according to the embodiment, as the nano-structure 19 performs a current spreading function and an electron blocking layer, the light emission efficiency of the light emitting device can be remarkably improved.

Figure 15:
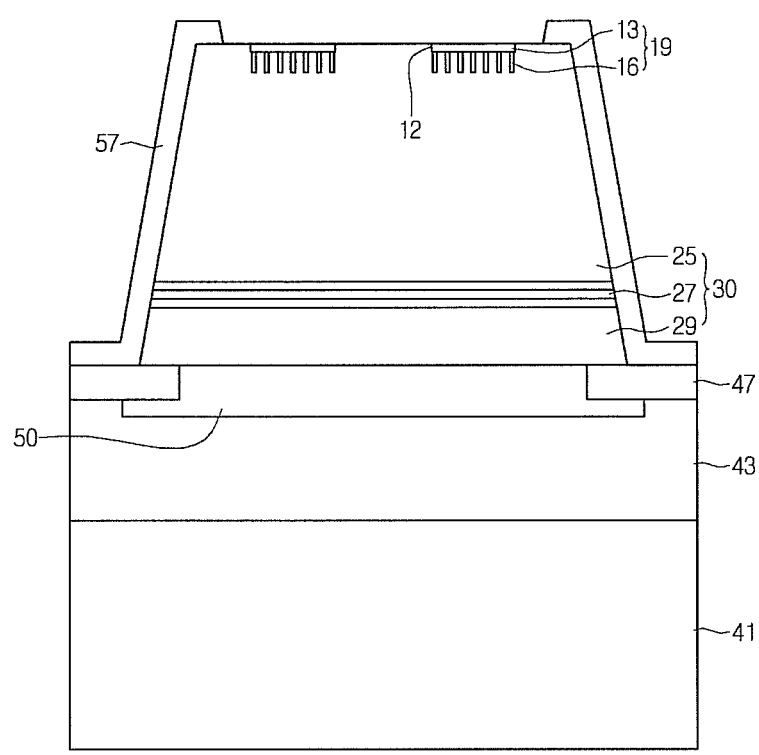
FIG. 15 is a sectional view showing a vertical-type light emitting device having the nano-structure shown in FIG. 13 according to a fourth embodiment.

FIG. 15 is a sectional view showing a vertical-type light emitting device according to a fourth embodiment.

The fourth embodiment is substantially the same as the first embodiment (see FIG. 4) except that the nano-structure 19 shown in FIG. 13 is employed.

Referring to FIG. 15, the vertical-type light emitting device according to the fourth embodiment may include the support substrate 41, the bonding layer 43, the electrode layer 50, channel layer 47, the light emitting structure 30, the nano-structure 19, and the protective layer 57.

The light emitting structure 30 may include the second conductive semiconductor layer 29 formed on the electrode layer 50 and the channel layer 47, the active layer 27 formed on the second conductive semiconductor layer 29, and the first conductive semiconductor layer 25 formed on the active layer 27.

The first conductive semiconductor layer 25 may include an N type semiconductor layer, and the second conductive semiconductor layer 29 may include a P type semiconductor layer, but the embodiment is not limited thereto.

Although not shown, a first semiconductor layer, for example, a buffer layer may be formed on the first conductive semiconductor layer 25, and the nano-structure 19 may be disposed on the buffer layer. In this case, the nano-textures 16 of the nano-structure 19 may be formed in the buffer layer.

The nano-structure 19 may be formed on the first conductive semiconductor layer 25. The nano-structure 19 may include the graphene layer 13 formed on the entire region of the first conductive semiconductor layer 25 and a plurality of nano-textures 16 formed on the graphene layer 13.

The graphene layer 13 may include a plurality of openings 12. The openings 12 may be spaced apart from each other. The opening 12 may have a circular shape as shown in FIG. 13, but the embodiment is not limited thereto. In other words, the opening 12 may have a square shape, a polygonal shape, an oval shape, or a bar-type shape.

The first conductive semiconductor layer 25 may be formed in the opening 12, but the embodiment is not limited thereto. In other words, the position of the top surface of the first conductive semiconductor layer 25 formed in the opening 12 may be the same as a position of the top surface of the graphene layer 13.

The nano-texture 16 may include ZnO, but the embodiment is not limited thereto. The nano-texture 16 may include a plurality of nano-rods, and may be spaced apart from each other by a uniform interval or an irregular interval. The nano-texture 16 may have the structure in which the height thereof is greater than the width thereof.

The electrode layer 50 may be formed under the light emitting structure 30, and the nano-structure 19 may be formed on the light emitting structure 30. Both of the electrode layer 50 and the nano-structure 19 may have a plate shape. The electrode layer 50 may have a width greater than the width of the nano-structure 19 and the width of the active layer 27.

Therefore, if power is applied to the nano-structure 19 and the support substrate 41, current flows in a vertical direction between the entire regions of the electrode layer 50 and the nano-structure 19 facing each other, and light is generated from the entire region of the active layer 27 of the light emitting structure 30, so that the light emission efficiency can be improved.

In particular, since the graphene layer 13 of the nano-structure 19 represents the greatest electrical conductivity among existing materials, current is more easily applied to the light emitting structure 30, so that the light emission efficiency can be remarkably improved.

Since the graphene layer 13 of the nano-structure 19 serves as an electrode in the vertical-type light emitting device shown in FIGS. 4 and 15, power may be applied to the nano-structure 19 and the electrode layer 50 without an additional electrode, so that the light emitting device can emit light.

In addition, since the graphene layer 13 or ZnO in the nano-structure 19 includes a transparent material, light generated from the light emitting structure 30 may be output upward through the nano-structure 19. In other words, since the nano-structure 19 represents superior light transmittance, the light generated from the light emitting structure 30 may pass through the nano-structure without light loss.

According to the embodiment, a nano-structure having a lattice constant less than that of the light emitting structure and greater than that of the substrate is disposed between the light emitting structure and the substrate, thereby growing the light emitting structure having superior crystallinity without dislocation. The above light emitting structure represents superior electrical and optical characteristics, so that the light emission efficiency can be improved.

According to the embodiment, the nano-structure is applied to the lateral-type light emitting device, so that the nano-structure serves as an electron blocking layer, thereby blocking elections of the semiconductor layer from being injected into the substrate, so that the light emission efficiency can be improved.

According to the embodiment, the nano-structure is applied to the lateral-type light emitting device, so that the nano-structure serves as a current spreading layer, thereby allowing current to flow through the nano-structure and the entire region of the transparent conductive layer. Therefore, light is generated from the entire region of the active layer, so that the light emission efficiency can be improved.

According to the embodiment, the nano-structure is applied to the vertical-type light emitting device, so that the nano-structure serves as a current spreading layer, thereby allowing current to flow through the nano-structure and the entire region of the transparent conductive layer. Therefore, light is generated from the entire region of the active layer, so that the light emission efficiency can be improved.

Figure 16:
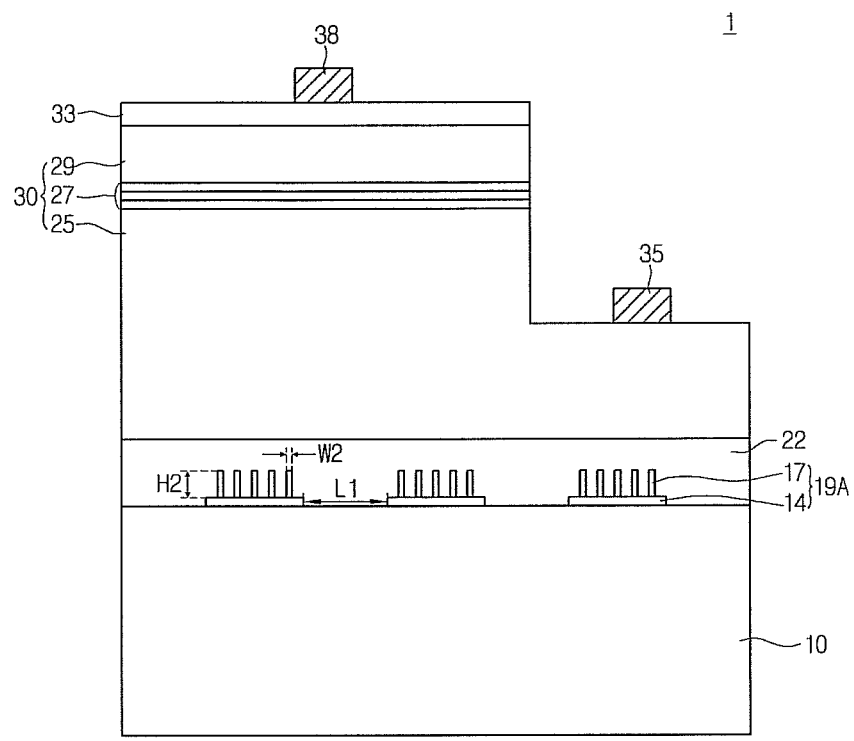
FIG. 16 is a sectional view showing a light emitting device according to a fifth embodiment.

FIG. 16 is a sectional view showing a light emitting device according to a fifth embodiment.

Referring to FIG. 16, a light emitting device 1C according to the fifth embodiment may include the substrate 10, a plurality of nano-structures 19A, the light emitting structure 30, the transparent conductive layer 33, and the first and second electrodes 35 and 38.

The light emitting structure 30 includes the first conductive semiconductor layer 25, the active layer 27, and the second conductive semiconductor layer 29.

Each nano-structure 19A may include a graphene pattern 14 and a plurality of nano-textures 17, but the embodiment is not limited thereto.

The light emitting device 1C according to the embodiment may include a buffer layer (22) disposed between the substrate 10 and the light emitting structure 30.

The light emitting device 1C according to the embodiment may further include another semiconductor layer (not shown) disposed under and/or on the light emitting structure 30. The light emitting device 1C may further include an undoped semiconductor layer (not shown) disposed between the buffer layer 22 and the light emitting structure 30.

The substrate 10 easily grows the light emitting structure 30, but the embodiment is not limited thereto. The substrate 10 may include a material representing a less lattice constant distance from the light emitting structure 30. The substrate 10 may include at least one selected from the group consisting of sapphire ($Al_2O_3$), SiC, Si, GaAs, GaN, ZnO, Si, GaP, InP, and Ge.

The buffer layer 22 may be disposed between the substrate 10 and the light emitting structure 30. The buffer layer 22 may be formed to reduce the lattice constant difference between the substrate 10 and the light emitting structure 30.

The buffer layer 22 and the light emitting structure 30 may include group II to VI compound semiconductor materials.

A lattice defect, for example, dislocation may occur between the light emitting structure 30 and the substrate 10 due to the lattice constant difference. The dislocation may refer to a boundary line formed in a direction perpendicular to the light emitting structure 30 due to the lattice defect between the substrate 10 and the light emitting structure 30. The dislocation may degrade the electrical and optical characteristics of the light emitting device and prevent light emission.

In order to solve the above problem, according to the fifth embodiment, a plurality of nano-structures 19A may be disposed between the substrate 10 and the buffer layer 22. Although not shown, if the buffer layer 22 is not used, the nano-structure 19A may be disposed between the substrate 10 and the light emitting structure 30.

Each nano-structure 19A may include a plurality of graphene patterns 14 and a plurality of nano-textures 16 faulted on each graphene pattern 14.

The graphene may be formed through various processes. For example, the graphene may be formed through a chemical synthesis scheme based on an oxidation-reduction for graphite, a CVD growing scheme, and an epoxy growth scheme. The graphene formed through the above scheme may constitute the graphene pattern 14 according to the fifth embodiment through a patterning process.

The graphene pattern 14 includes graphene that has the thinnest thickness among materials, which are known until now, can most excellently conduct electricity or heat, includes the most flexible material, and may be extended or bent with the superior elasticity. In addition, the graphene pattern 14 may have a transmittance function to transmit light. The graphene patterns 14 may be formed on the substrate 10.

The interval L1 between the graphene patterns 14 may be in the range of 0.1 μm to 100 μm, for example, in the range of 10 μm to 50 μm.

Therefore, a portion of the buffer layer 22 may contact with the substrate 10 through the region between the graphene patterns 14.

After the graphene pattern 14 has been previously formed, the graphene pattern 14 may be attached onto the substrate 10. Alternatively, the graphene pattern 14 may be directly formed on the substrate 10. When the graphene pattern 14 is directly formed on the substrate 10, a protective layer is partially formed on the substrate 14, a graphene layer is formed on the substrate 10 through a chemical synthesis scheme, a CVD growing scheme, and an epoxy growth scheme, and the protective layer is removed. In this case, although the graphene patterns 14 may be formed on the substrate 10, the embodiment is not limited thereto.

The nano-textures 17 may be formed on each graphene pattern 14. In order to partially grow the nano-texture 17 on the graphene pattern 14, a seed pattern may be formed, and the seed pattern may be formed on the graphene pattern 14.

The nano-texture 16 may include ZnO, and the lattice constant of the ZnO is about 3.25. The lattice constant of the sapphire used for the substrate 10 is about 4.78, and the lattice constant of GaN that may be used for the light emitting structure 30 is about 3.18.

Accordingly, since the lattice constant of ZnO has an intermediate value between the lattice constant of the sapphire and the lattice constant of GaN, the GaN may be sufficiently grown on the nano-structure 19 without the dislocation thereof due to ZnO.

The nano-texture 17 may include a plurality of nano-rods. The nano-rods may be spaced apart from each other by a uniform interval, or by an irregular interval. The nano-rod may have the structure in which the height thereof is greater than the width thereof, but the embodiment is not limited thereto.

For example, the width W2 of the nano-texture 17 may be in the range of 5 nm to 500 nm, for example, in the range of 50 nm to 200 nm. The height H2 of the nano-texture 17 may be in the range of 10 nm to 3 µm, for example, in the range of 500 nm to 1 µm.

The height H2 of the nano-texture 16 may be higher than the width W2 of the nano-texture 16. Accordingly, when the buffer layer 22 or the light emitting structure 30 is grown on the nano-structure 19A, the group II to VI compound semiconductor materials, for example, GaN is mainly grown in a vertical direction between the nano-textures 16, and may be grown in a vertical direction or a horizontal direction on the nano-texture 16. Therefore, the dislocation may not occur, and superior crystallinity may be obtained, thereby improving the electrical and optical characteristics of the light emitting device 1C.

For example, the thickness of the buffer layer 22 may be in the range of 20 nm to 50 nm, but the embodiment is not limited thereto.

The height H2 of the nano-texture 16 may be greater than the thickness of the buffer layer 22. Therefore, the top surface of the buffer layer 22 may be positioned higher than the top surface of the nano-textures 17. In other words, the buffer layer 22 may be formed between the nano-textures 17. Therefore, the buffer layer 22 may be disposed in the region between the nano-textures 17, and the light emitting structure 30 may be disposed on the nano-textures 17.

Alternatively, if the height H2 of the nano-texture 17 is less than the thickness of the buffer layer 22, the buffer layer 22 may be disposed in the region between the nano-textures 17 and on the nano-textures 17.

The thickness of the first conductive semiconductor layer 25 of the light emitting structure 30 may be in the range of 2 µm to 3 µm, but the embodiment is not limited thereto.

In this case, if the light emitting structure 30 is formed on the nano-structure 19A without the buffer layer 22, the light emitting structure 30 may be formed in the region between the nano-textures 17 and on the nano-textures 17.

Figure 17:
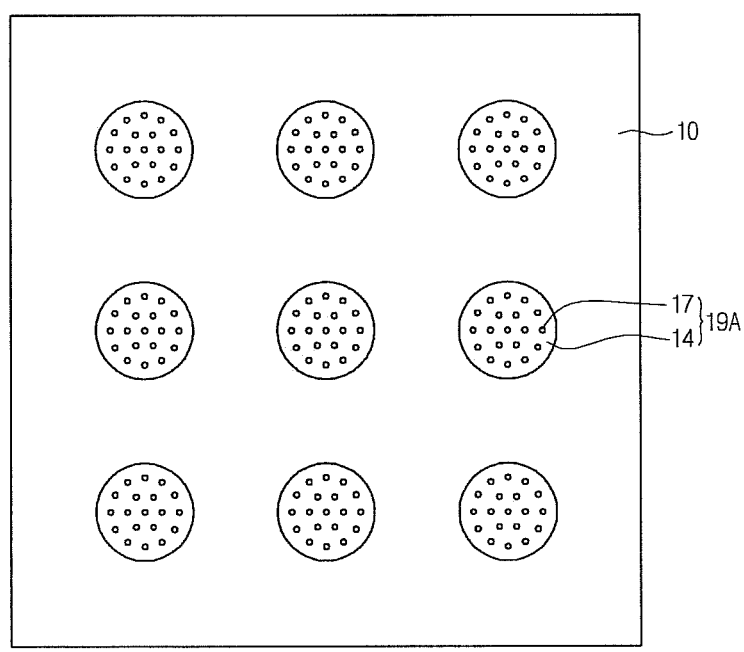
FIG. 17 is a plan view showing one example of the nano-structure shown in FIG. 16.
Figure 18:
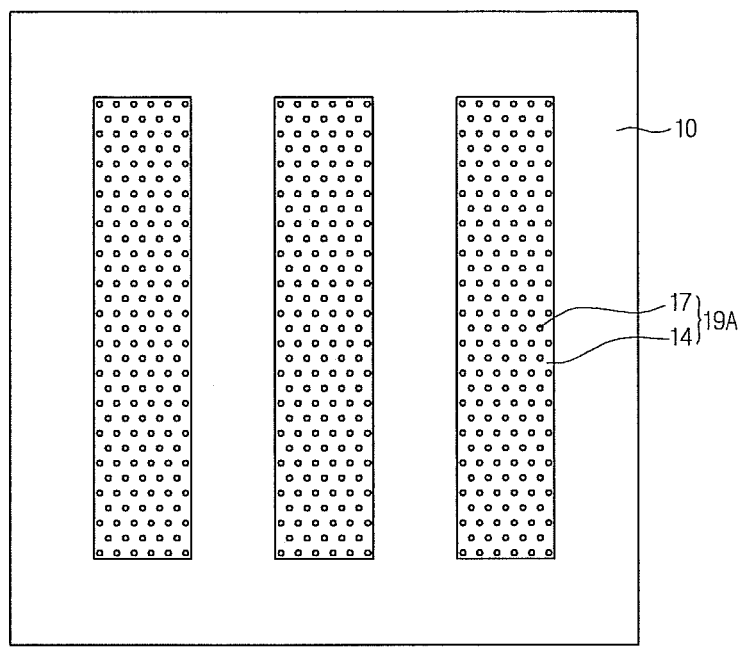
FIG. 18 is a plan view showing another example of the nano-structure shown in FIG. 16.

The nano-structure 19A may have the shape shown in FIGS. 17 and 18, but the embodiment is not limited thereto.

In other words, as shown in FIG. 17, the graphene pattern 14 may have a circular shape. As shown in FIG. 18, the graphene pattern 14 may longitudinally extend in the shape of a bar.

The graphene patterns 14 may be spaced apart from each other by a uniform interval or an irregular interval.

The buffer layer 22 may be formed on the nano-structure 19A. The buffer layer 22 may include group II to VI compound semiconductor materials. For example, the buffer layer 22 may include one of GaN, InN, AlGaN and InGaN, or may have a multi-layer structure including the above materials, but the embodiment is not limited thereto.

As shown in FIG. 16, the buffer layer 22 may contact with the substrate 10 through the region between the graphene patterns 14 of the nano-structure 19A, make contact with the top surface of the graphene pattern 14 through the region between the nano-textures 17 of the nano-structure 19A, and be disposed on the nano-textures 17. This case corresponds to the case that the thickness of the buffer layer 22 is greater than the height of the nano-texture 17.

Although not shown, if the thickness of the buffer layer 22 is less than the height of the nano-texture 16, the buffer layer 22 may contact with the substrate 10 through the region between the graphene patterns 14 of the nano-structure 19A, and may be formed lower than the top surface of the nano-texture 15 in the region between the nano-textures 17. In this case, the buffer layer 22 is not formed on the nano-textures 17. In other words, although the buffer layer 22 is grown in the vertical direction from the substrate 10, or grown in the vertical direction from the graphene pattern 14 in the region between the nano-textures 17, the buffer layer 22 is not grown on the nano-texture 17. In other words, the buffer layer 22 is not formed on the nano-texture 17.

However, as shown in FIG. 16, if the thickness of the buffer layer 22 is greater than the height of the nano-texture 17, the buffer layer 22 may be grown in the vertical direction from the graphene pattern 14 in the region between the nano-textures 17. In addition, the buffer layer 22 may be grown in the vertical direction or the horizontal direction from the top surface of the nano-textures 17 in the region between the nano-textures 17. Accordingly, the portion of the buffer layer 22 grown on the nano-textures 17 is combined with the portion of the buffer layer 22 grown in the region between the nano-textures 17. Therefore, the buffer layer 22 may be formed even on the nano-textures 17.

The principle of growing the buffer layer 22 on the nano-structure 19A is identically applicable to the case that the light emitting structure 30 is grown on the nano-structure 19A, but the embodiment is not limited thereto. In other words, the light emitting structure 30 may be formed on the buffer layer 22 or the nano-structure 19A.

For example, the light emitting structure 30 may include the first conductive semiconductor layer 25, the active layer 27, and the second conductive semiconductor layer 29. The first conductive semiconductor layer 25 may be formed on the buffer layer 22 or the nano-structure 19A, the active layer 27 may be faulted on the first conductive semiconductor layer 25, and the second conductive semiconductor layer 29 may be formed on the active layer 27.

For example, the first conductive semiconductor layer 25 may include an N type semiconductor layer including N type dopants. The N type semiconductor layer includes a semiconductor material having a composition formula of $In_xAl_yGa_{1-x-y}N$ ($0 \leq x \leq 1$, $0 \leq y \leq 1$, $0 \leq x+y \leq 1$). For example, the N type semiconductor layer may include at least one of InAlGaN, GaN, AlGaN, InGaN, AlN, InN and AlInN, and may be doped with N type dopants such as Si, Ge, and Sn.

The active layer 27 may be formed on the first conductive semiconductor layer 25. The active layer 27 may generate light having a wavelength corresponding to the energy band-gap difference varied depending on a material constituting the active layer 27 through the recombination of first carriers (e.g., electrons), which are injected through the first conductive semiconductor layer 27, and second carriers (e.g., holes) injected through the second conductive semiconductor layer 29.

The active layer 27 may include one of a multi quantum well (MQW) structure, a quantum dot structure, or a quantum wire structure. The active layer 27 may be formed by repeatedly laminating group II to VI compound semiconductors at a cycle of a well layer and a barrier layer. For example, the active layer 27 may be formed at a cycle of InGaN well layer/GaN barrier layer, a cycle of InGaN well layer/AlGaN barrier layer, or a cycle of InGaN well layer/InGaN barrier layer. The bandgap of the barrier layer may be greater than the bandgap of the well layer.

The active layer 27 may be disposed thereon with the second conductive semiconductor layer 29. For example, the second conductive semiconductor layer 29 may include a P type semiconductor layer including P type dopants. The P type semiconductor layer may include a semiconductor material having a composition formula of $In_xAl_yGa_{1-x-y}N$ ($0 \le x \le 1$, $0 \le y \le 1$, and $0 \le x+y \le 1$). For example, the P type semiconductor layer may include at least one selected from the group consisting of InAlGaN, GaN, AlGaN, InGaN, AlN, InN and AlInN, and may be doped with P type dopants such as Mg, Zn, Ca, Sr, and Ba. The second conductive semiconductor layer 29 may be formed in a single layer structure or a multi-layer structure.

The transparent conductive layer 33 may be formed on the second conductive semiconductor layer 29, and the second electrode 38 may be formed on a portion of the transparent conductive layer 33.

The first electrode 35 may be formed on a portion of the first conductive semiconductor layer 25 of the light emitting structure 30. To this end, the second conductive semiconductor layer 29 and the active layer 27 may be removed through a mesa etching process, and a portion of the top surface of the first conductive semiconductor layer 25 may be removed. The first electrode 35 may be formed on the first conductive semiconductor layer 25 that is partially removed.

The second electrode 38 is formed on the upper most part of a light emitting device 1C, and the first electrode 35 is formed on a lateral side of the light emitting device 1C. If power is applied to the first and second electrodes 35 and 38, since current flows through the light emitting structure 30 corresponding to the shortest path between the first and second electrodes 35 and 38, light may not be generated through the entire region of the active layer 27 of the light emitting structure 30.

Accordingly, the transparent conductive layer 33 is formed on the entire region or a portion of the second conductive semiconductor layer 29 while being disposed between the second conductive semiconductor layer 29 and the second electrode 38. The transparent conductive layer 33 spreads current, and the current flows between the first electrode 35 and the transparent conductive layer 33, so that light is generated from the entire region of the active layer 27 of the light emitting structure 30. Therefore, the light emission efficiency can be improved.

The first and second electrodes 35 and 38 may include the same electrode material or materials different from each other.

The first and second electrodes 35 and 38 include an opaque metallic material. For example, the first and second electrodes 35 and 38 may include one selected from the group consisting of aluminum (Al), titanium (Ti), chrome (Cr), nickel (Ni), platinum (Pt), gold (Au), tungsten (W), copper (Cu) and molybdenum (Mo), or the alloy thereof, but the embodiment is not limited thereto.

The transparent conductive layer 33 includes a conductive material representing superior transmittance to transmit light and electrical conductivity. For example, the transparent conductive layer 33 may include at least one selected from the group consisting of ITO, IZO (In—ZnO), GZO (Ga—ZnO), AZO (Al—ZnO), AGZO (Al—GaZnO), IGZO (In—GaZnO), IrOx, RuOx, RuOx/ITO, Ni/IrOx/Au and Ni/IrOx/Au/ITO.

Figure 19:
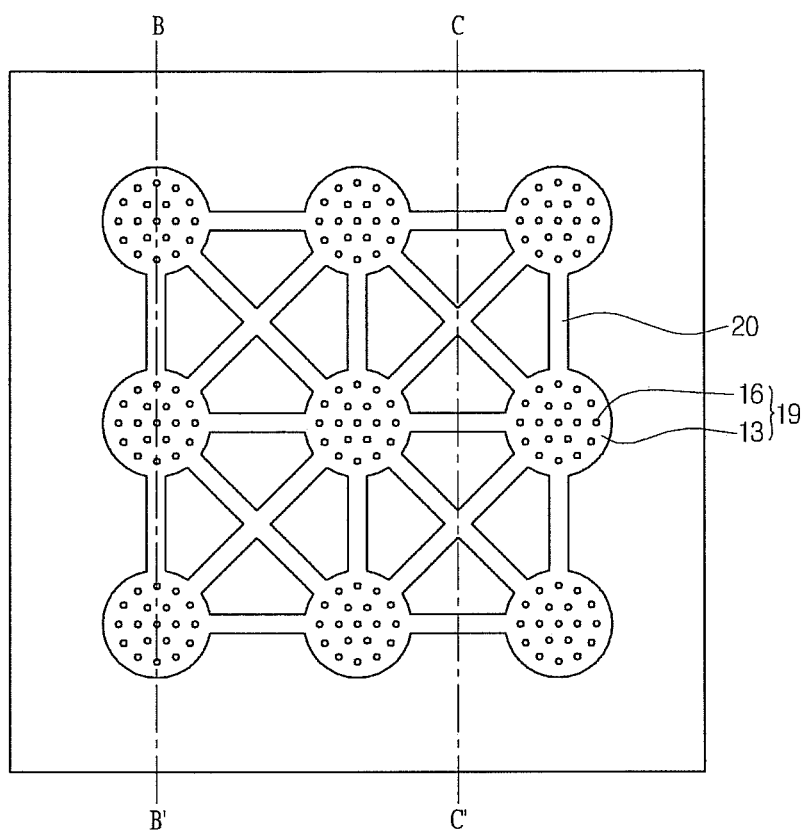
FIG. 19 is a plan view showing a light emitting device according to the sixth embodiment.
Figure 20:
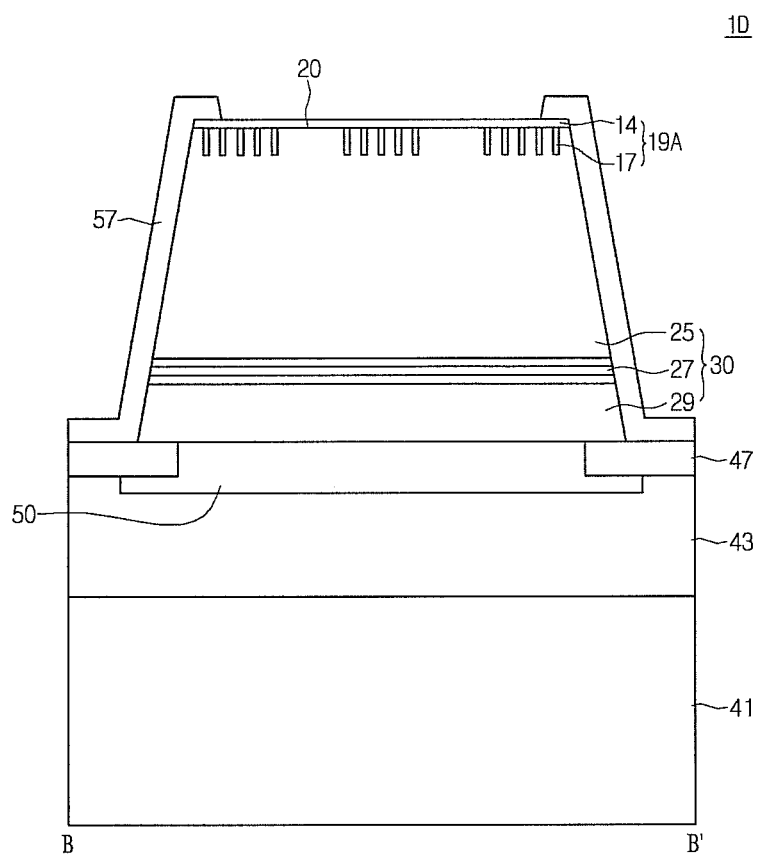
FIG. 20 is a sectional view taken along line B-B' of the light emitting device shown in FIG. 19.
Figure 21:
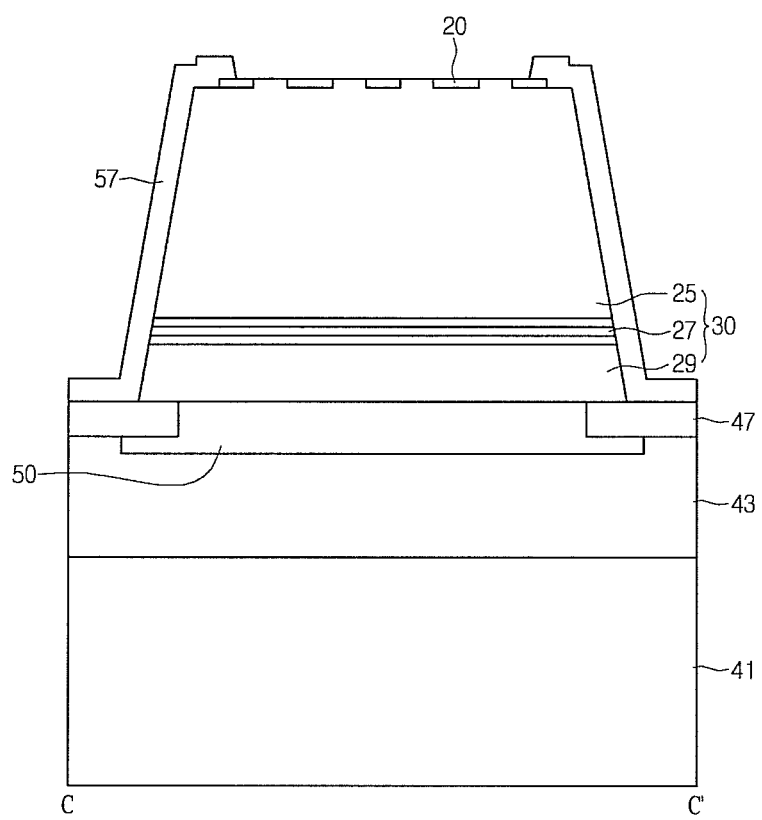
FIG. 21 is a sectional view taken along line C-C' of the light emitting device shown in FIG. 19.

FIG. 19 is a plan view showing a light emitting device according to the sixth embodiment, and FIG. 20 is a sectional view taken along line B-B' of the light emitting device of FIG. 19. FIG. 21 is a sectional view taken along line C-C' of the light emitting device shown in FIG. 19.

According to the sixth embodiment, the nano-structure 19A may serve as an electrode. Accordingly, the nano-structure 19A may overlap with the electrode layer 50 in the vertical direction. In addition, according to the sixth embodiment, the electrode layer 50 may serve as a reflective layer with a width greater than a width of at least the active layer 27 of the light emitting structure 30. The electrode layer 50 reflects the light generated from the active layer 27 forwardly, so that the light loss can be reduced.

Referring to FIGS. 19 to 21, a vertical-type light emitting device 1D according to the second embodiment may include the support substrate 41, the bonding layer 43, the electrode layer 50, the channel layer 47, the light emitting structure 30, a nano-structure 19A, and the protective layer 57.

The support substrate 41, the bonding layer 43, and the electrode layer 50 may constitute an electrode member to supply power.

The support substrate 41 may support a plurality of layers formed thereon and serve as an electrode. The support substrate 41 may supply power to the light emitting structure 30 together with the nano-structure 19A.

The support substrate 41 may include a metallic material or a semiconductor material, but the embodiment is not limited thereto. The support substrate 41 may include a material representing higher electrical conductivity and higher thermal conductivity. For example, the support substrate 41 may include a metallic material including at least one selected from the group consisting of titanium (Ti), chrome (Cr), nickel (Ni), aluminum (Al), platinum (Pt), gold (Au), tungsten (W), copper (Cu), a copper alloy (Cu Alloy), molybdenum (Mo) and copper-tungsten (Cu—W). For example, the support substrate 41 may include a semiconductor material including at least one selected from the group consisting of Si, Ge, GaAs, GaN, ZnO, SiGe, and SiC.

The support substrate 41 is plated and/or deposited under the light emitting structure 30. Alternatively, the support substrate 41 may be attached under the light emitting structure 30 in the form of a sheet, but the embodiment is not limited thereto.

The bonding layer 43 may be formed on the support substrate 41. The bonding layer 43 is disposed between the electrode layer 50 and the support substrate 41. The bonding layer 43 may serve as a medium to enhance bonding strength between the electrode layer 50 and the support substrate 41.

The bonding layer 43 may include barrier metal or bonding metal. The bonding layer 43 may include a metallic material representing higher adhesive property and higher thermal conductivity. The bonding layer 43 may include at least one selected from the group consisting of Ti, Au, Sn, Ni, Nb, Cr, Ga, In, Bi, Cu, Ag and Ta.

A barrier layer, which is not shown, may be formed on the bonding layer 43. The barrier layer may prevent materials constituting the bonding layer 43 and the support substrate 41, which are formed under the barrier layer, from being spread to the electrode layer 50 and the light emitting structure 30, which are formed above the barrier layer, to spread the characteristic of the light emitting device. The barrier layer may include a single layer selected from the group consisting of Ni, Pt, Ti, W, V, Fe and Mo, or may have the lamination structure of at least two layers including the above materials. The barrier layer may contact with the bottom surface of the electrode layer 50.

The top surface of the bonding layer 43 may have a groove, a peripheral region of which may extend upward of the central region thereof, that is, may extend to the light emitting structure 30, but the embodiment is not limited thereto. The electrode layer 50 may contact with the central region of the top surface of the bonding layer 43 or may be formed in the groove, but the embodiment is not limited thereto.

Although not shown, in the top surface of the bonding layer 43, the central region and the peripheral regions may be located in the same line. In other words, the entire region of the top surface of the bonding layer 43 may have a flat surface. In this case, the electrode layer 50 may be formed at the central region of the top surface of the bonding layer 43 or may be formed on the entire region of the top surface of the bonding layer 43.

The width of the electrode layer 50 may be smaller than or equal to the width of the bonding layer 43. The top surface of the electrode layer 50 and the top surface of the channel layer 47 may be formed on the same line.

The bottom surface of the electrode layer 50 may be formed in a position different from that of the bottom surface of the channel layer 47. In other words, since the electrode layer 50 is formed on the central region of the bonding layer 43 having the groove therein, and the channel layer 47 is formed on the peripheral region of the bonding layer 43, the bottom surface of the electrode layer 50 may be formed in a position lower than that of the bottom surface of the channel layer 47.

As shown in FIGS. 20 and 21, a portion of the electrode layer 50 may overlap with the bottom surface of the channel layer 47 in the vertical direction. In other words, the inner region of the channel layer 47 may extend inward of the outer wall of the electrode layer 50.

The electrode layer 50 reflects light incident from the light emitting structure 30 to improve the light extraction efficiency. The electrode layer 50 makes ohmic contact with the light emitting structure 30, so that current may flow through the light emitting structure 30. Although not shown, the electrode layer 50 may include a reflective layer making contact with the top surface of the bonding layer 43 and an ohmic contact layer formed between the top surface of the reflective layer and the bottom surface of the light emitting structure 30. The electrode layer 50 may include a single layer including the mixture of the reflective material and the ohmic contact material. In the electrode layer 50, the reflective layer may not be formed separately from the ohmic contact layer. For example, the reflective material includes at least one selected from the group consisting of Ag, Ni, Al, Rh, Pd, Ir, Ru, Mg, Zn, Pt, Au and Hf, or the alloy of at least two of the above materials, but the embodiment is not limited thereto. The ohmic contact material may include a transparent conductive material. For example, the ohmic contact material may include at least one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IrOx, RuOx, RuOx/ITO, Ni, Ag, Ni/IrOx/Au, and Ni/IrOx/Au/ITO.

The electrode layer 50 may have a multiple layer including one of IZO/Ni, AZO/Ag, IZO/Ag/Ni, and AZO/Ag/Ni.

The electrode layer 50 may make ohmic contact with at least the light emitting structure 30. Accordingly, current is smoothly supplied to the light emitting structure 30 making ohmic contact with the electrode layer 50, so that the light emission efficiency can be improved.

The electrode layer 50 may overlap with the bottom surfaces of the light emitting structure 30 and the channel layer 47. In order to reflect the entire portion of light from the light emitting structure 30, the width of the electrode layer 50 may be wider than that of at least the light emitting structure 30, especially, the active layer 27.

The channel layer 47 may be formed on the electrode layer 50. The channel layer 47 may be formed along the peripheral region of the bottom surface of the second conductive semiconductor layer 29. The channel layer 47 may be formed along the peripheral portion of the edge region of the electrode layer 50. In other words, the channel layer 47 may be formed at the peripheral region between the light emitting structure 30 and the electrode layer 50. In detail, at least a portion of the channel layer 47 is surrounded by the electrode layer 50 and the light emitting structure 30. For example, a portion of the top surface of the channel layer 47 may contact with the second conductive semiconductor layer 29, and the inner lateral side and a portion of the bottom surface of the channel layer 47 may contact with the electrode layer 50, but the embodiment is not limited thereto. An opposite portion of the bottom surface of the channel layer 47 may contact with the peripheral region of the top surface of the bonding layer 43.

The channel layer 47 may prevent the electrical short between the lateral side of the bonding layer 43 and the lateral side of the light emitting structure 30 caused by external materials. If the electrode layer 50 is formed on the entire region of the bonding layer 43, so that the outer lateral side of the electrode layer 50 is exposed to the outside, the channel layer 47 may prevent the electrical short between the lateral side of the electrode layer 50 and the lateral side of the light emitting structure 30.

In addition, the channel layer 47 ensures the contact area with the light emitting structure 30 as widely as possible, thereby effectively preventing the light emitting structure 30 from being delaminated from the electrode layer 50 when performing a laser scribing process to separate a plurality of chips into individual chips and a laser lift off (LLO) process to remove the substrate.

When the light emitting structure 30 is over-etched in the chip separation process, the electrode layer 50 may be exposed. In this case, the electrical short between the electrode layer 50 and the active layer 27 of the light emitting structure 30 may be caused by the foreign matters at the outer region of the light emitting device. The channel layer 47 can prevent the electrode layer 50 from being exposed due to the over-etching of the light emitting structure 30 in the chip separation process.

The channel layer 47 may include an insulating material. For example, the channel layer 47 may include at least one selected from the group consisting of $SiO_2$, $SiO_x$, $SiO_xN_y$, $Si_3N_4$, and $Al_2O_3$. The channel layer 47 may include a metallic material, but the embodiment is not limited thereto.

The light emitting structure 30 may be formed on the electrode layer 50 and the channel layer 47.

The lateral side of the light emitting structure 30 may be perpendicularly or inclined in the etching process to separate a plurality of chips into individual chips. For example, the lateral side of the light emitting structure 30 may be formed through an isolation etching process.

The light emitting structure 30 may include a plurality of compound semiconductor materials including group II to V elements. The compound semiconductor materials including group II to VI elements include at least one of group II-V compound semiconductors and group III-V compound semiconductors.

The light emitting structure 30 may include the second conductive semiconductor layer 29, the active layer 27 on the second conductive semiconductor layer 29, and the first conductive semiconductor layer 25 on the active layer 27.

In this case, the bottom surface of the second conductive semiconductor layer 29 may contact with the top surfaces of the electrode layer 50 and the channel layer 47, but the embodiment is not limited thereto. Further, in order to reflect the entire portion of the light generated from the active layer 27, the width of the active layer 27 may be narrower than that of the electrode layer 50.

The channel layer 47 may include a first channel region overlapping with the second conductive semiconductor layer 29 in a vertical direction and a second channel region that does not overlap with the second conductive semiconductor layer 29.

The first channel region extends inward of the outer sidewall of the second conductive semiconductor layer 29 and overlaps with the second conductive semiconductor layer 29 in the vertical direction. The second channel region may extend outward of the first channel region to the outer sidewall of the bonding layer 43.

The second conductive semiconductor layer 29 may be formed on the electrode layer 50 and the channel layer 47. The second conductive semiconductor layer 29 may include a P type semiconductor layer including P type dopants. The second conductive semiconductor layer 29 may include compound semiconductors including group II to VI elements. For example, the second conductive semiconductor layer 29 may include one selected from the group consisting of GaN, AlN, AlGaN, InGaN, InN, InAlGaN, AlInN, AlGaAs, GaP, GaAs, GaAsP, and AlGaInP. The P type dopant may include Mg, Zn, Ga, Sr, or Ba. The first conductive semiconductor layer 25 may include a single layer or a multi-layer, but the embodiment is not limited thereto.

The second conductive semiconductor layer 29 supplies a plurality of carriers, for example, a plurality of holes to the active layer 27.

The active layer 27 is formed on the second conductive semiconductor layer 29, and may include one of a single quantum well (SQW), a multi quantum well (MQW) structure, a quantum dot structure, or a quantum wire structure, but the embodiment is not limited thereto.

The active layer 27 may be formed by repeatedly laminating compound semiconductors including group II to VI elements at a cycle of a well layer and a barrier layer. The active layer 27 may include a compound semiconductor material such as GaN, InGaN, and AlGaN. Accordingly, the active layer 27 may be formed at a cycle of InGaN well layer/GaN barrier layer, a cycle of InGaN well layer/AlGaN barrier layer, or a cycle of InGaN well layer/InGaN barrier layer, but the embodiment is not limited thereto.

The active layer 27 may be formed on the first conductive semiconductor layer 25. The active layer 27 may generate light having a wavelength corresponding to the energy bandgap difference varied depending on a material constituting the active layer 27 through the recombination of electrons, which are injected through the first conductive semiconductor layer 27, and holes injected through the second conductive semiconductor layer 29.

Although not shown, a conductive clad layer may be formed on and/or below the active layer 27, and may include an AlGaN-based semiconductor. For example, a P type clad layer including P type dopants may be formed between the second conductive semiconductor layer 29 and the active layer 27, and an N type clad layer including N type dopants may be formed between the active layer 27 and the first conductive semiconductor layer 25.

The conductive clad layer performs a guide function so that the holes and the electrons supplied from the active layer 27 are not moved to the first conductive semiconductor layer 25 and the second conductive semiconductor layer 29. Accordingly, more many holes and electrons supplied from the active layer 27 are recombined with each other, so that the light emission efficiency of the light emitting device can be improved.

The first conductive semiconductor layer 25 may be formed on the active layer 27. The first conductive semiconductor layer 25 may include an N type semiconductor layer including N type dopants. The first conductive semiconductor layer 25 may include a compound semiconductor including group II to VI elements. For example, the first conductive semiconductor layer 25 may include one selected from the group consisting of GaN, AlN, AlGaN, InGaN, InN, InAlGaN, AlInN, AlGaAs, GaP, GaAs, GaAsP and AlGaInP. The N type dopant may include Si, Ge, Sn, Se, or Te. The first conductive semiconductor layer 25 may include a single layer or a multi-layer, but the embodiment is not limited thereto.

When the light emitting structure 30 is grown, the first conductive semiconductor layer 25, the active layer 27, and the second conductive semiconductor layer 29 may be sequentially grown.

Referring to FIG. 20, the nano-structures 19A may be formed on the light emitting structure, in detail, on the first conductive semiconductor layer 25.

As shown in FIG. 19, the nano-structure 19A may include a plurality of graphene patterns 14, a plurality of nano-textures 16 formed on each graphene pattern 14, and a connection part 20 to connect the graphene patterns 14 to each other.

Since the graphene patterns 14 and the nano-textures 17 have been described in detail in the first embodiment, the details thereof will be omitted.

The connection part 20 and the graphene pattern 14 may include the same material, for example, graphite. Therefore, the graphene pattern 14 and the connection part 20 may be simultaneously formed. The connection part 20 may connect adjacent graphene patterns 14 to each other. In this case, the connection may include electrical connection together with physical connection.

Since the adjacent graphene patterns 14 are connected with each other through the connection part 20, if power is applied to one of the graphene patterns 14, current may be supplied to the adjacent graphene patterns 14 through the connection part 20. In other words, current may be spread to the adjacent graphene patterns 14.

Figure 22:
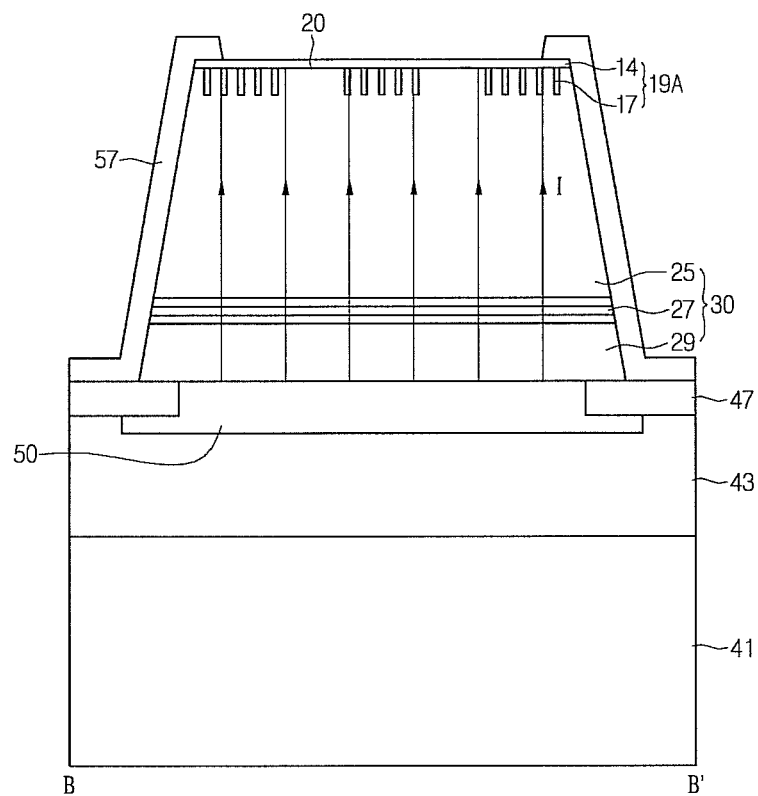
FIG. 22 is a sectional view showing the current flow in the light emitting device shown in FIG. 20.

Accordingly, as shown in FIG. 22, the graphene patterns 14 and the connection part 20 correspond to the entire region of the electrode layer 50. The graphene patterns 14 and the connection part 20 allow current to flow in a surface-to-surface manner between the entire region of the electrode layer 50 and the entire region of the nano-structure 19A. Therefore, the light is emitted from the entire region of the active layer 27 of the light emitting structure 30, so that the light emission efficiency can be improved.

A plurality of nano-textures 17 may be formed on the bottom surface of the graphene pattern 14. In other words, the nano-textures 17 may extend from the bottom surface of the graphene pattern 14 to the inner portion of the first conductive semiconductor layer 25. The nano-texture 16 may include ZnO, but the embodiment is not limited thereto.

As described with reference to the fifth embodiment, the nano-textures 16 allows the light emitting structure 30 to be grown with superior crystallinity instead of the dislocation on the light emitting structure 30.

The numerical range of the nano-structure 19A may be the same as that described in the fifth embodiment, but the embodiment is not limited thereto. The interval between the graphene patterns 14 may be in the range of 0.1 μm to 100 μm, for example, the range of 10 μm to 50 μm.

Therefore, the first conductive semiconductor layer 25 may be disposed in the range between the graphene patterns 14 and the range between the nano-textures 17. For example, the first conductive semiconductor layer 25 may extend to the position the same as the position of the top surface of the graphene pattern 14 through the region between the graphene patterns 14.

The nano-texture 16 may include a plurality of nano-roads, but the embodiment is not limited thereto. The nano-roads may be spaced apart from each other by a uniform interval or an irregular interval. The nano-texture 17 may have the structure in which the height thereof is greater than the width thereof, but the embodiment is not limited thereto. The height and the width of the nano-texture 17 may be substantially the same as those of the nano-texture 17 according to the fifth embodiment.

In FIGS. 20 and 21, the nano-structure 19A is formed in the first conductive semiconductor layer 25, but the embodiment is not limited thereto.

The nano-structure 19A may be formed in the buffer layer (not shown). In this case, the buffer layer may be formed on the first conductive semiconductor layer 25, and the nano-structure 19A may be formed in the buffer layer. In other words, the nano-texture 17 may extend from the bottom surface of the graphene pattern 14 to the inner part of the buffer layer.

If the height of the nano-texture 17 is greater than the thickness of the buffer layer, the nano-texture 17 may extend into the first conductive semiconductor layer 25 through the buffer layer, but the embodiment is not limited thereto.

The protective layer 57 may be formed on the light emitting structure 30. For example, the protective layer 57 may be formed on at least the lateral side of the light emitting structure 30. In detail, one end of the protective layer 57 may be formed at the peripheral region of the top surface of the first conductive semiconductor layer 25, and the protective layer 57 may be disposed at the lateral side of the first conductive semiconductor layer 25, the lateral side of the active layer 27, the lateral side of the second conductive semiconductor layer 29, and a portion of the top surface of the channel layer 47, but the embodiment is not limited thereto.

The protective layer 57 may prevent, the electrical short between the light emitting structure 30 and the support substrate 41 while protecting the light emitting device 1D from external shock. The protective layer 57 may include a material representing superior transparency and an insulating property. For example, the protective layer 57 may include one selected from the group consisting of $SiO_2$, $SiO_x$, $SiO_xN_y$, $Si_3N_4$, $TiO_2$, and $Al_2O_3$, but the embodiment is not limited thereto.

Although the protective layer 57 may include a material the same as that of the channel layer 47, the embodiment is not limited thereto.

Although drawings are shown in that the light emitting device 1D according to the sixth embodiment includes an electrode, the graphene pattern 14 of the nano-structure 19A serves as an electrode. Accordingly, although an additional electrode is not formed, the light emitting device 1D may emit light by applying power to the nano-structure 19A and the electrode layer 50.

In addition, since the graphene pattern 14 and ZnO of the nano-structure 19A is a transparent material, the light generated from the light emitting structure 30 may be output upward through the nano-structure 19A. In other words, since the nano-structure 19A represents superior light transmittance, the light generated from the light emitting structure 30 may pass through the nano-structure 19A without light loss.

The nano-structure 19A according to the embodiment is applicable to a flip-type light emitting device as well as the lateral-type light emitting device according to the fifth embodiment and the vertical-type light emitting device according to the sixth embodiment. In the case of the flip-type light emitting device including the nano-structure 19A, a reflective layer including a metallic material representing superior reflectance may be formed instead of the transparent conductive layer 33 shown in FIG. 16 (fifth embodiment). In this case, the light generated from the light emitting structure 30 is reflected by the reflective layer, so that the light can be output to the outside through the substrate 10.

Figure 27:
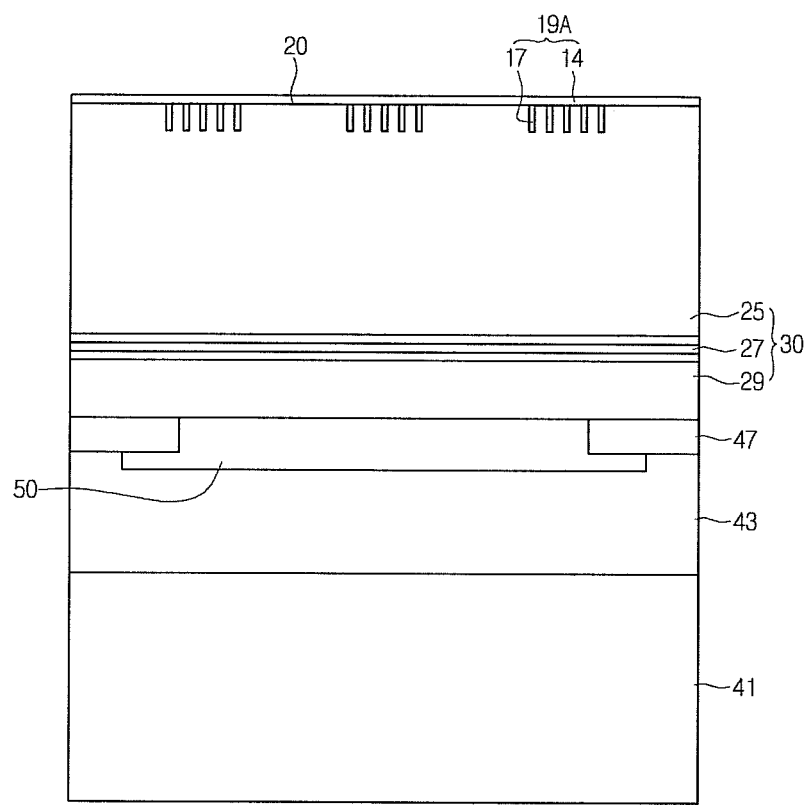
FIG. 27 is a sectional view showing the nano-structure shown in FIG. 26 having no substrate.
Figure 28:
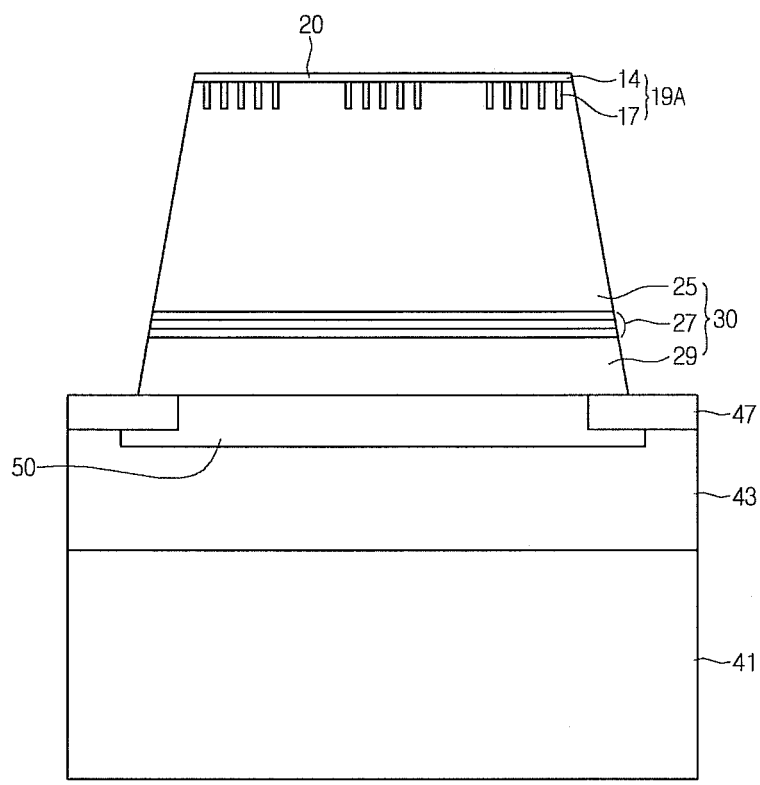
FIG. 28 is a sectional view showing that the peripheral portion of the light emitting structure shown in FIG. 27 is etched.
Figure 29:
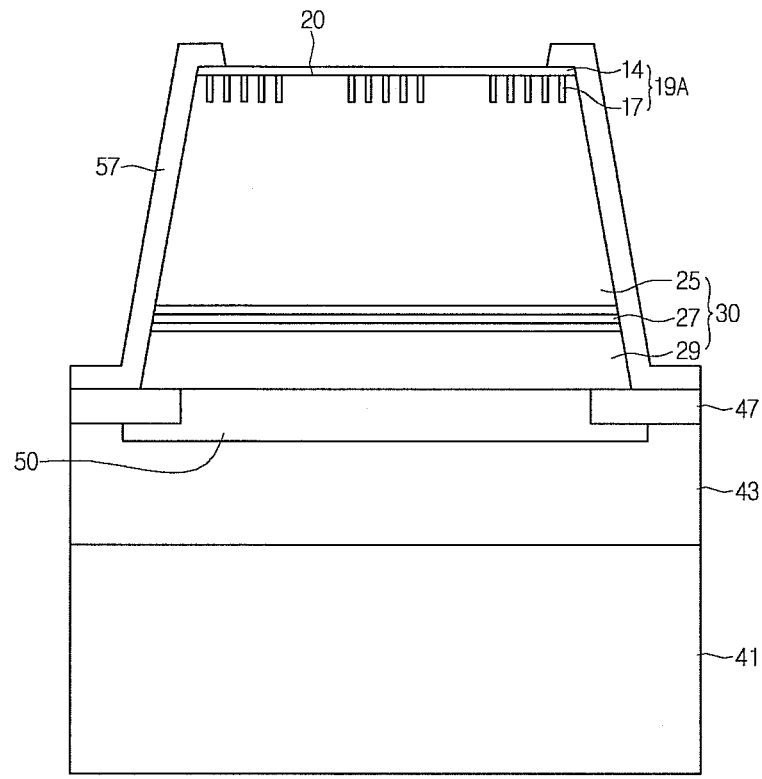
FIG. 29 is a sectional view showing a protective layer formed on the surface of the light emitting structure shown in FIG. 28.

FIGS. 23 to 29 are sectional views showing the process of fabricating the light emitting device shown in FIG. 29.

Figure 23:
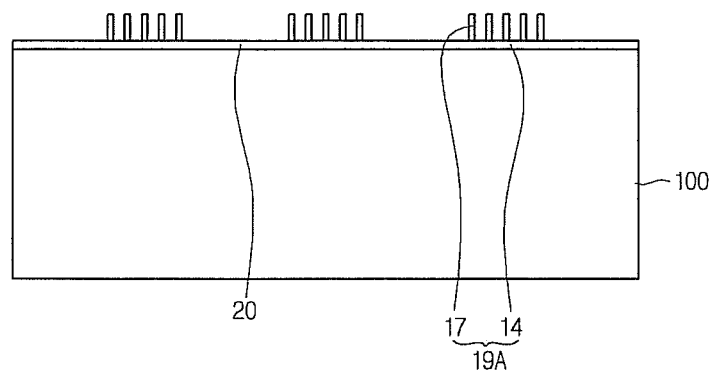
FIG. 23 is a sectional view showing a nano-structure formed on the substrate in the process of fabricating the light emitting device shown in FIG. 20.

Referring to FIG. 23, the nano-structure 19A may be formed on the growth substrate 100.

The growth substrate 100 is a substrate to grow the light emitting structure 30. The growth substrate 100 may include a material suitable for the growth of a semiconductor material, that is, a carrier wafer. In addition, the growth substrate 100 may include a material representing having a lattice constant approximate to the lattice constant of the light emitting structure and representing thermal stability. The growth substrate 100 may include a conductive substrate or an insulating substrate.

The growth substrate 100 may include at least one selected from the group consisting of sapphire ($Al_2O_3$), SiC, Si, GaAs, GaN, ZnO, Si, GaP, InP, and Ge.

The nano-structure 19A may include a plurality of graphene patterns 14, a plurality of connection parts 20, and a plurality of nano-textures 17. The graphene patterns 14 and the connection part 20 may be simultaneously formed. For example, the graphene layer 14 and the connection part 20 are previously formed and attached onto the growth substrate 100. Alternatively, for example, after forming a graphene layer on the growth substrate 100 through a chemical synthesis scheme, a CVD growing scheme, and an epoxy growth scheme, the graphene layer is patterned, thereby forming the graphene patterns 14 and the connection parts 20.

Thereafter, the nano-textures 17 may be formed on the graphene layer 14 by performing a deposition process or a growing process with respect to the top surface of the growth substrate 100 by using ZnO. For example, the nano-texture 17 may be formed through a CVD growing scheme or a sputtering scheme, but the embodiment is not limited thereto. The nano-texture 17 may include ZnO, but the embodiment is not limited thereto.

Accordingly, the nano-structure 19A may be formed by the graphene patterns 14, the connection parts 20, and the nano-textures 17.

Figure 24:
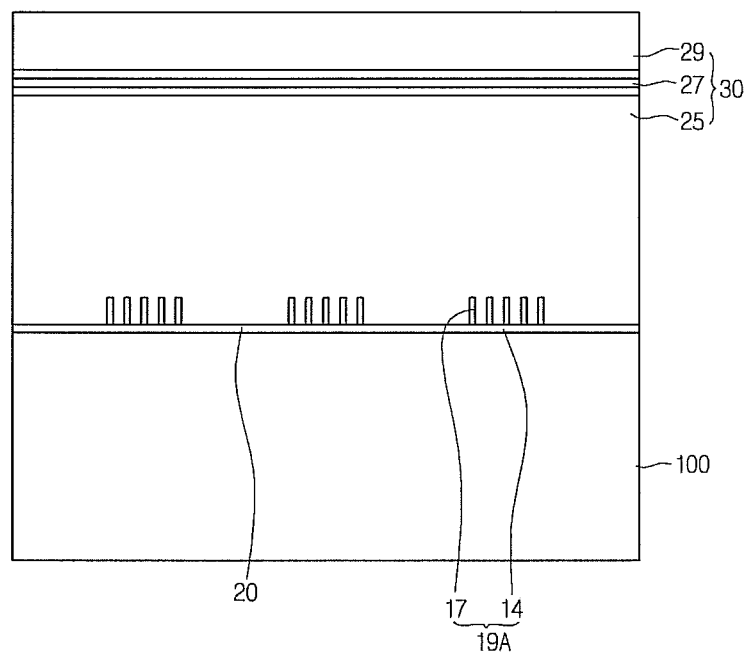
FIG. 24 is a sectional view showing a light emitting structure formed on the nano-structure shown in FIG. 23.

Referring to FIG. 24, the light emitting structure 30 may be formed by sequentially growing the first conductive semiconductor layer 25, the active layer 27, and the second conductive semiconductor layer 29 on the nano-structure 19A.

For example, the light emitting structure 30 may be formed through an MOCVD (Metal Organic Chemical Vapor Deposition), a CVD (Chemical Vapor Deposition), a PECVD (Plasma-Enhanced Chemical Vapor Deposition), an MBE (Molecular Beam Epitaxy), or an HVPE (Hydride Vapor Phase Epitaxy), but the embodiment is not limited thereto.

A buffer layer (not shown) may be formed between the light emitting structure 30 and the growth substrate 100 to reduce the lattice constant difference therebetween. In other words, the buffer layer may be grown on the nano-structure 19A, and the light emitting structure 30 may be grown on the buffer layer.

The first conductive semiconductor layer 25 may be formed on the growth substrate 100 and the nano-structure 19A. The first conductive semiconductor layer 25 may be an N type semiconductor layer including N type dopants.

In detail, the first conductive semiconductor layer 25 may be formed on the growth substrate 100 between the graphene patterns 14 of the nano-structure 19A, and on the graphene pattern 14 between the nano-textures 17 of the nano-structure 19A.

The lattice constant of ZnO is about 3.25. The lattice constant of the substrate 10, for example, the lattice constant of the sapphire used for the growth substrate 100 is about 4.78, and the lattice constant of GaN that may be used for the first conductive semiconductor layer 25 is about 3.18.

Accordingly, since the lattice constant difference between the first conductive semiconductor layer 25 and the growth substrate 100 is less than an the lattice constant difference between the first conductive semiconductor layer 25 and the nano-structure 19A, in detail, the nano-texture 16, the first conductive semiconductor layer 25 may be smoothly grown on the nano-structure 19A without dislocation.

The active layer 27 is formed on the first conductive semiconductor layer 25, and may include one of a multi quantum well (MQW) structure, a quantum dot structure, or a quantum wire structure, but the embodiment is not limited thereto.

The active layer 27 may be formed on the first conductive semiconductor layer 25. The active layer 27 may generate light having a wavelength corresponding to the energy bandgap difference varied depending on a material constituting the active layer 27 through the recombination of electrons, which are injected through the first conductive semiconductor layer 27, and holes injected through the second conductive semiconductor layer 29.

The second conductive semiconductor layer 29 may be formed on the active layer 27. The second conductive semiconductor layer 29 may include a P type semiconductor layer including P type dopants.

Figure 25:
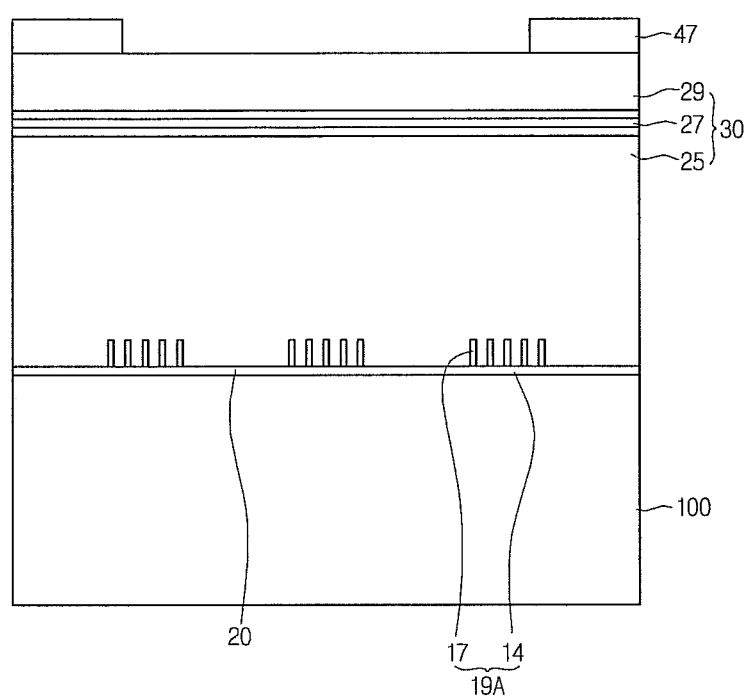
FIG. 25 is a sectional view showing a channel layer formed on the light emitting structure shown in FIG. 24.

Referring to FIG. 25, the second conductive semiconductor layer 29 may be disposed thereon with the channel layer 47. The channel layer 47 may be formed on the second conductive semiconductor layer 29. For example, the channel layer 47 may be formed at the peripheral region of the second conductive semiconductor layer 29, but the embodiment is not limited thereto. The channel layer 47 may include an insulating material, and the details of the insulating material will be omitted since the description of the insulating material has been made above.

Figure 26:
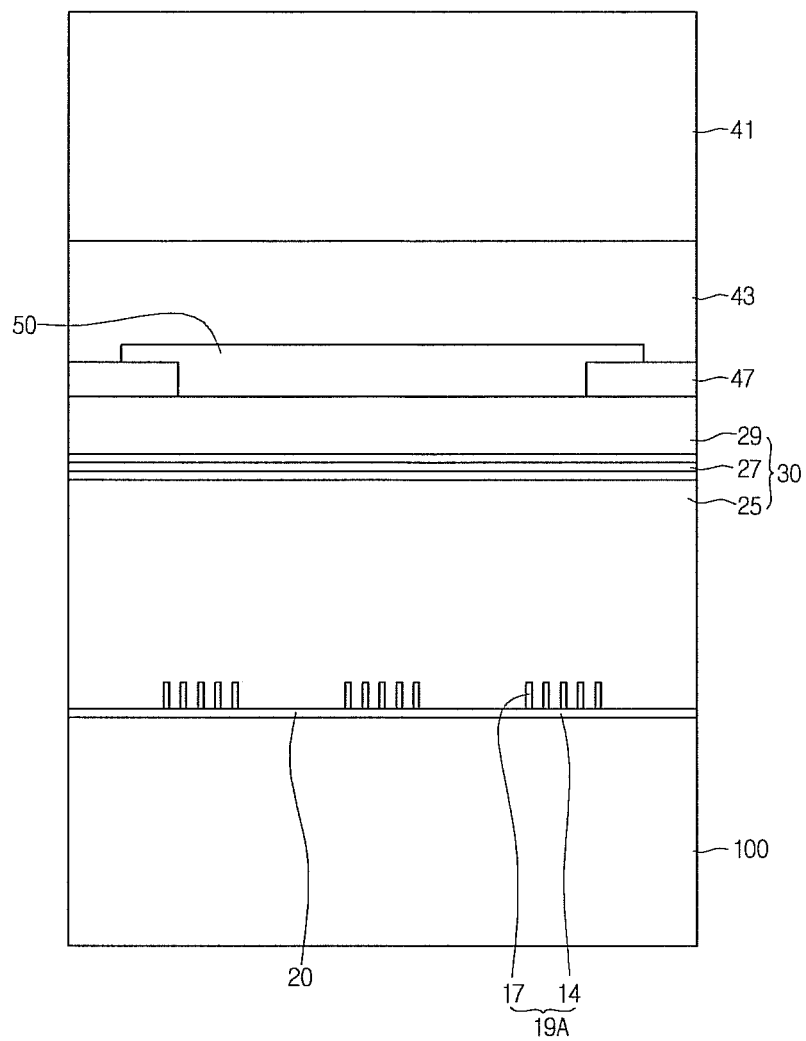
FIG. 26 is a sectional view showing a channel layer shown in FIG. 25 provided thereon with an electrode layer, a bonding layer, and a support substrate.

Referring to FIG. 26, the electrode layer 50, the bonding layer 43, and the support substrate 41 may be formed on the channel layer 47 and the second conductive semiconductor layer 29.

The electrode layer 50 may include an ohmic contact layer and a reflective layer sequentially laminated on the second conductive semiconductor layer 29. The electrode layer 50 may include a single layer including the mixture of an ohmic contact material and a reflective material on the second conductive semiconductor layer 29. The reflective material may include at least one selected from the group consisting of Ag, Ni, Al, Rh, Pd, Ir, Ru, Mg, Zn, Pt, Au, and Hf, or the alloy of two of the above materials, but the embodiment is not limited thereto. The ohmic contact material may selectively include a conductive material and a metallic material. In other words, the ohmic contact material may include at least one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IrOx, RuOx, RuOx/ITO, Ni, Ag, Ni/IrOx/Au, and Ni/IrOx/Au/ITO.

The bonding layer 43 may be faulted to enhance the bonding strength between the support substrate 41 and the electrode layer 50. For example, the bonding layer 43 may include at least one selected from the group consisting of Ti, Au, Sn, Ni, Nb, Cr, Ga, In, Bi, Cu, Ag, and Ta.

The support substrate 41 not only supports a plurality of layers formed thereon, but also serves as an electrode. The support substrate 41 may supply power to the light emitting structure 30 together with the electrode. The support substrate 41 may include at least one of Ti, Cr, Ni, Al, Pt, Au, W, Cu, Mo, and Cu—W.

The support substrate 41 is plated and/or deposited on the light emitting structure 30. Alternatively, the support substrate 41 may be attached on the light emitting structure 30 in the form of a sheet, but the embodiment is not limited thereto.

Referring to FIG. 27, after reversing the growth substrate 100 at 180°, the growth substrate 100 may be removed from the nano-structure 19A.

The growth substrate 100 may be removed through an LLO (Laser Lift Off) scheme, a CLO (Chemical Lift Off) scheme, or a physical polishing scheme, but the embodiment is not limited thereto.

When the growth substrate 100 is removed through the LLO scheme, the growth substrate 100 may be separated from the nano-structure 19A by concentratedly irradiating a laser to the interfacial surface between the growth substrate 100 and the first conductive semiconductor layer 25.

When the growth substrate 100 is removed through the CLO scheme, the growth substrate 100 may be removed by using a wet etching process to the extent that the first conductive semiconductor layer 25 is exposed.

When the growth substrate 100 is removed through the physical polishing scheme, the growth substrate 100 may be sequentially removed from the top surface thereof by directly polishing the growth substrate 100 to the extent that the first conductive semiconductor layer 25 is exposed.

According to the sixth embodiment, the nano-structure 19A is formed between the light emitting structure 30 and the growth substrate 100. Since the nano-structure 19A represents a weaker bonding strength with the growth substrate 100, the growth substrate 100 can be easily separated from the nano-structure 19A by irradiating a laser therebetween. In other words, the nano-structure 19A easily separates the growth substrate 100 from the light emitting structure 30. Therefore, the nano-structure 19 can prevent the defect such as a crack from being produced on the light emitting structure 30 due to the impact derived from laser power by irradiating a laser for a long time if the growth substrate 100 is not easily separated.

Referring to FIG. 28, a mesa etching process may be performed so that the lateral side of the light emitting structure 30 and the lateral side of the channel layer 47 are exposed while the lateral sides of the light emitting structure 30 and the channel layer 47 are inclined. Through the mesa etching process, the top surface of the channel layer 47 is disposed therein with a groove in which the light emitting structure 30 is not disposed. In other words, the groove may be formed by removing outer regions of the second conductive semiconductor layer 29, the active layer 27, and the first conductive semiconductor layer 25 formed on the channel layer 47 through the mesa etching process.

Since the channel layer 47 serves as an etching stopper, the outer regions of the first conductive semiconductor layer 25, the active layer 27, and the second conductive semiconductor layer 29 are removed through the mesa etching process, and the electrode layer 50, the bonding layer 43, and the support substrate 41 are not removed.

Referring to FIG. 29, the protective layer 57 may be formed on at least the light emitting structure 30. In other words, the protective layer 57 may be formed from the peripheral portion of the top surface of the first conductive semiconductor layer 25 of the light emitting structure 30 to the lateral side of the first conductive semiconductor layer 25, the lateral side of the active layer 27, and the lateral side of the second conductive semiconductor layer 29, and may be formed to a portion of the top surface of the channel layer 47.

The protective layer 57 may prevent the electrical short between the light emitting structure 30 and the support substrate 41. The protective layer 57 may include a material representing superior transparency and a superior insulating property. For example, the protective layer 57 may include one selected from the group consisting of $SiO_2$, $SiO_x$, $SiO_xN_y$, $Si_3N_4$, $TiO_2$ and $Al_2O_3$, but the embodiment is not limited thereto. The protective layer 57 may include a material the same as a material constituting the channel layer 47.

Figure 30:
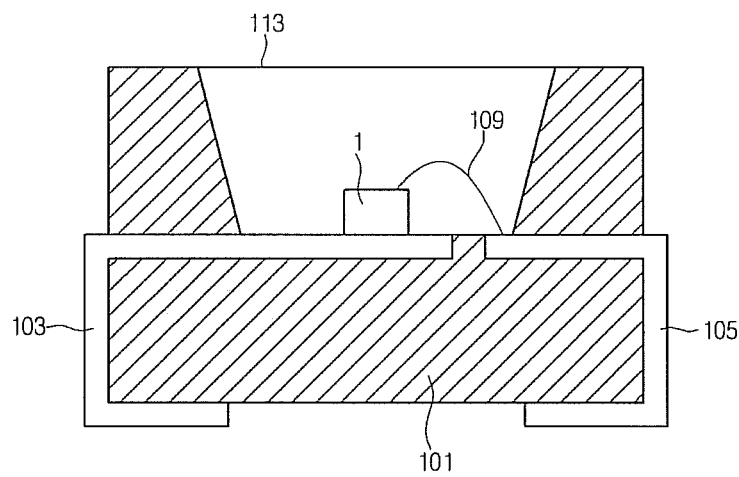
FIG. 30 is a sectional view showing a light emitting device package according to the embodiment.

FIG. 30 is a sectional view showing a light emitting device package according to the embodiment.

Referring to FIG. 30, the light emitting device package according to the embodiment includes a body 101, first and second lead electrodes 103 and 105 installed in the body 101, a light emitting device 1 according to the first to sixth embodiments installed in the body 101 to receive power from the first and second lead electrodes 103 and 105, and a molding member 113 surrounding the light emitting device 1.

The body 101 may include a silicon material, a synthetic resin material, or a metallic material, and inclined surfaces may be formed at a peripheral portion of the light emitting device 1.

The first and second lead electrodes 103 and 105 are electrically isolated from each other and supply power to the light emitting device 1.

In addition, the first and second lead electrodes 103 and 105 may reflect the light generated from the light emitting device 1 to improve the light efficiency, and discharge the heat emitted from the light emitting device 1 to the outside.

The light emitting device 1 may be installed on one of the first and second lead electrodes 103 and 105 and the body 101, and may be electrically connected to the first and second lead electrodes 103 and 105 through a wire scheme or a die bonding scheme, but the embodiment is not limited thereto.

According to the embodiment, although the description has been made in that the light emitting device 1 is electrically connected to one of the first and second lead electrodes 103 and 105 through one wire 109, but the embodiment is not limited thereto. In other words, the light emitting device 1 may be electrically connected to the first and second lead electrodes 103 and 105 through two wires, or may be electrically connected to the first and second lead electrodes 103 and 105 without a wire.

The molding member 113 may surround the light emitting device 1 to protect the light emitting device 1. In addition, the molding member 113 may include phosphors to convert the wavelength of the light emitted from the light emitting device 1.

The light emitting device package 200 according to the embodiment includes a COB (chip on board) type light emitting device package. The top surface of the body 101 may be flat, and a plurality of light emitting device may be installed in the body 101.

According to the embodiment, a nano-structure having a lattice constant less than that of the light emitting structure and greater than that of the substrate is disposed between the light emitting structure and the substrate, thereby growing the light emitting structure having superior crystallinity without dislocation. The above light emitting structure represents superior electrical and optical characteristics, so that the light emission efficiency can be improved.

According to the embodiment, the nano-structure is applied to the lateral-type light emitting device, so that the nano-structure serves as an electron blocking layer, thereby blocking elections of the semiconductor layer from being injected into the substrate, so that the light emission efficiency can be improved.

According to the embodiment, the nano-structure is applied to the lateral-type light emitting device, so that the nano-structure serves as a current spreading layer, thereby allowing current to flow through the nano-structure and the entire region of the transparent conductive layer. Therefore, light is generated from the entire region of the active layer, so that the light emission efficiency can be improved.

According to the embodiment, the nano-structure is applied to the vertical-type light emitting device, so that the nano-structure serves as a current spreading layer, thereby allowing current to flow through the nano-structure and the entire region of the transparent conductive layer. Therefore, light is generated from the entire region of the active layer, so that the light emission efficiency can be improved.

A light emitting device or a light emitting device package according to the embodiment is applicable to a light unit. The light unit is applicable to a display device and a lighting device, for example, a unit such as a lighting lamp, a signal lamp, a headlight of a vehicle, an electric board, and an indication lamp.

An embodiment provides a light emitting device capable of improving light emission efficiency through current spreading.

An embodiment provides a light emitting device capable of improving electrical and optical characteristics.

According to an embodiment, there is provided a light emitting device. The light emitting device includes a nano-structure, a first semiconductor layer on the nano-structure, an active layer on the first semiconductor layer, and a second conductive semiconductor layer on the active layer. The nano-structure includes a graphene layer disposed under the first semiconductor layer contacted with the first semiconductor layer, and a plurality of nano-textures extending from a top surface of the graphene layer in a direction toward the first semiconductor layer and contacted with the first semiconductor layer.

According to an embodiment, there is provided a light emitting device. The light emitting device includes a light emitting structure comprising a first conductive semiconductor layer, an active layer disposed under the first conductive semiconductor layer, and a second conductive semiconductor layer disposed under the active layer, a plurality of nano-structures on a top surface of the light emitting structure, an electrode layer under the light emitting structure, a bonding layer disposed under the electrode layer, and a support substrate under the bonding layer. Each nano-structure includes a graphene pattern contacted with a top surface of the first conductive semiconductor layer, and a plurality of nano-textures protruding from the graphene pattern to the active layer. A connection part is disposed to connect the graphene patterns of the nano-structure with each other, and the nano-texture comprises a material different from materials constituting the graphene patterns or the connection part.

According to an embodiment, there is provided a light emitting device including a substrate, a nano-structure disposed on the substrate, and a light emitting structure disposed on the nano-structure and including a first conductive semiconductor layer, an active layer, and a second conductive semiconductor layer. The nano-structure includes a graphene layer disposed on the substrate, and a plurality of nano-textures disposed on the graphene layer.

According to an embodiment, there is provided a light emitting device. The light emitting device includes an electrode layer, a light emitting structure disposed on the electrode layer and including a first conductive semiconductor layer, an active layer, and a second conductive semiconductor layer, and a nano-structure disposed on the light emitting structure. The nano-structure includes a graphene layer on the substrate and a plurality of nano-textures on a graphene layer.

According to an embodiment, there is provided a light emitting device including a substrate, a nano-structure disposed on the substrate, and a light emitting structure disposed on the nano-structure. The nano-structure includes a plurality of graphene patterns disposed on the substrate and a plurality of nano-textures disposed on the graphene pattern.

According to an embodiment, there is provided a light emitting device including an electrode layer, a light emitting structure disposed on the electrode layer, and a nano-structure disposed on the light emitting structure. The nano-structure includes a plurality of graphene patterns disposed on the substrate and a plurality of nano-textures disposed on the graphene pattern.

According to an embodiment, there is provided a light emitting device package including a body, first and second lead electrodes disposed on the body, a light emitting device disposed on the body and one of the first and second lead electrodes, and a molding member to surround the light emitting device.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a nano-structure;
a first semiconductor layer provided over the nano-structure;
an active layer provided over the first semiconductor layer;
a second conductive semiconductor layer provided over the active layer; and
a substrate disposed under the nano-structure,
wherein the nano-structure comprises:
a graphene layer provided under the first semiconductor layer and in contact with the first semiconductor layer; and
a plurality of nano-textures extending from a top surface of the graphene layer in a direction toward the first semiconductor layer and in contact with the first semiconductor layer, and
wherein the graphene layer comprises a plurality of openings, and a portion of the first semiconductor layer makes contact with a top surface of the substrate through each opening of the graphene layer.

2. The light emitting device of claim 1, wherein the first semiconductor layer comprises an N type semiconductor layer, and the nano-structure is connected to the N type semiconductor layer.

3. The light emitting device of claim 1, wherein the first semiconductor layer comprises a buffer layer on the nano-structures and an N type semiconductor layer on the buffer layer, and the nano-textures are contacted with the buffer layer and the N type semiconductor layer.

4. The light emitting device of claim 1, wherein a lower portion of the first semiconductor layer is contacted with the top surface of the graphene layer through a region between the nano-textures.

5. The light emitting device of claim 1, wherein the nano-textures comprise zinc oxide (ZnO).

6. The light emitting device of claim 1, wherein the graphene layer is contacted with a top surface of the substrate.

7. The light emitting device of claim 1, wherein each of the nano-textures has a lattice constant between a lattice constant of the substrate and a lattice constant of the first semiconductor layer.

8. The light emitting device of claim 1, further comprising at least one of a transparent conductive layer and a reflective layer on the second conductive semiconductor layer.

9. The light emitting device of claim 1, wherein the first semiconductor layer comprises a first conductive semiconductor layer, and is electrically connected to the nano-structure, and the graphene layer comprises a transparent electrode.

10. The light emitting device of claim 1, wherein each nano-texture has a width in a range of 5 nm to 500 nm, and has a height in a range of 10 nm to 3 μm.

11. The light emitting device of claim 1, wherein each nano-texture has a width in a range of 5 nm to 500 nm.

12. The light emitting device of claim 1, wherein each nano-texture has a height in a range of 10 nm to 3 μm.

13. A light emitting device comprising:
a nano-structure;
a first semiconductor layer provide over the nano-structure;
an active layer provide over the first semiconductor layer;
a second conductive semiconductor layer provide over the active layer; and
a substrate disposed under the nano-structure,
wherein the nano-structure comprises:
- a graphene layer provide under the first semiconductor layer and in contact with the first semiconductor layer;
- a plurality of nano-textures extending from a top surface of the graphene layer in a direction toward the first semiconductor layer and in contact with the first semiconductor layer, and
- wherein the graphene layer comprises a plurality of graphene patterns spaced apart from each other, and the nano-textures are disposed on the graphene patterns, respectively.

14. The light emitting device of claim 13, wherein the first semiconductor layer is disposed between the graphene patterns and the substrate, and disposed in a region between the graphene patterns contacted with the graphene patterns disposed under a region between the substrate and the nano-textures.

15. The light emitting device of claim 13, further comprising a first conductive semiconductor layer between the first semiconductor layer and the active layer,
wherein the first semiconductor layer comprises a buffer layer, and the buffer layer makes contact with the top surface of the substrate, a top surface of the graphene patterns, and the nano-textures.

16. The light emitting device of claim 13, wherein an interval between the graphene patterns is in a range of 0.1 μm to 100 μm.

17. A light emitting device comprising:
a substrate;
a nano-structure on the substrate;
a first semiconductor layer disposed on the nano-structure;
a first electrode on a first region of the first semiconductor layer;
an active layer disposed on a top surface of the first semiconductor layer;
a second conductive semiconductor layer disposed on the active layer; and
a second electrode on the second conductive semiconductor layer,
wherein the nano-structure comprises:
- a graphene layer disposed under the first semiconductor layer and contacted with the first semiconductor layer; and
- a plurality of nano-textures extending from a top surface of the graphene layer in a direction toward the first semiconductor layer and contacted with the first semiconductor layer,
wherein a portion of the nano-structure overlaps with the first electrode in a vertical direction, and
wherein the graphene layer comprises a plurality of openings, and a portion of the first semiconductor layer makes contact with a top surface of the substrate through each opening of the graphene layer.

18. The light emitting device of claim 17, wherein the first semiconductor layer comprises an N type semiconductor layer, and the nano-structure is connected to the N type semiconductor layer, and
wherein a lower portion of the first semiconductor layer is contacted with the top surface of the graphene layer through a region between the nano-textures.

19. The light emitting device of claim 17, wherein the first semiconductor layer comprises a buffer layer on the nano-structures and an N type semiconductor layer on the buffer layer, and the nano-textures are contacted with the buffer layer and the N type semiconductor layer.

20. The light emitting device of claim 17, wherein each nano-texture has a width in a range of 5 nm to 500 nm, and has a height in a range of 10 nm to 3 μm.

* * * * *